(12) United States Patent
Kimura et al.

(10) Patent No.: US 9,991,304 B2
(45) Date of Patent: Jun. 5, 2018

(54) IMAGE PICKUP DEVICE HAVING AN INFRARED ABSORPTION LAYER BETWEEN A LAMINATE BAND-PASS LAYER AND A LOW REFRACTIVE INDEX LAYER ABOVE ON-CHIP LENSES

(71) Applicant: SONY CORPORATION, Tokyo (JP)

(72) Inventors: Nozomi Kimura, Kanagawa (JP);
Shinji Imaizumi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days. days.

(21) Appl. No.: 15/024,146

(22) PCT Filed: Nov. 20, 2014

(86) PCT No.: PCT/JP2014/005839
§ 371 (c)(1),
(2) Date: Mar. 23, 2016

(87) PCT Pub. No.: WO2015/079662
PCT Pub. Date: Jun. 4, 2015

(65) Prior Publication Data
US 2016/0293650 A1    Oct. 6, 2016

(30) Foreign Application Priority Data

Nov. 26, 2013   (JP) ................................ 2013-244424
Apr. 16, 2014   (JP) ................................ 2014-085056

(51) Int. Cl.
*H01L 27/146*     (2006.01)
*G02B 5/22*       (2006.01)
(Continued)

(52) U.S. Cl.
CPC ........ *H01L 27/14627* (2013.01); *G02B 5/223* (2013.01); *G02B 5/26* (2013.01);
(Continued)

(58) Field of Classification Search
None
See application file for complete search history.

(56) References Cited

U.S. PATENT DOCUMENTS 8,872,293 B2 * 10/2014 Takachi ................. G02B 5/282
                                                       257/432
9,523,803 B2 * 12/2016 Iwasaki .................... G02B 5/22
(Continued)

FOREIGN PATENT DOCUMENTS

JP    SHO 62-254579    11/1987
JP    2003-244560      8/2003
(Continued)

*Primary Examiner* — Marc Armand
*Assistant Examiner* — Younes Boulghassoul
(74) *Attorney, Agent, or Firm* — Chip Law Group

(57) ABSTRACT

An image pickup device according to the present technique includes an on-chip lens, a low-refractive-index layer, and an infrared absorption layer. The on-chip lens is formed of a high-refractive-index material. The low-refractive-index layer is formed flat on the on-chip lens and formed of a low-refractive-index material. The infrared absorption layer is formed of an infrared absorption material and laminated as a higher layer than the low-refractive-index layer. The infrared absorption material includes an infrared absorption pigment and a binder resin, the binder resin, being a synthetic resin constituted of a siloxane skeleton alone or a synthetic resin constituted of a siloxane skeleton part and a partial skeleton having a low reaction activity in an oxygen part.

17 Claims, 15 Drawing Sheets

(51) Int. Cl.
*G02B 5/26* (2006.01)
*H01L 31/09* (2006.01)

(52) U.S. Cl.
CPC .... *H01L 27/1462* (2013.01); *H01L 27/14621* (2013.01); *H01L 27/14625* (2013.01); *H01L 27/14685* (2013.01); *H01L 31/09* (2013.01)

(56) References Cited

U.S. PATENT DOCUMENTS

| | | | | |
|---|---|---|---|---|
| 2003/0164891 | A1* | 9/2003 | Akimoto | H04N 5/2253 348/340 |
| 2004/0185588 | A1* | 9/2004 | Fukuyoshi | G02B 3/0012 438/22 |
| 2007/0109548 | A1* | 5/2007 | Uchida | H01L 27/14621 356/456 |
| 2012/0205766 | A1* | 8/2012 | Takachi | G02B 5/282 257/432 |
| 2012/0256284 | A1* | 10/2012 | Yukawa | H01L 27/14618 257/432 |
| 2013/0094075 | A1* | 4/2013 | Saitoh | G02B 5/0833 359/350 |
| 2015/0146057 | A1* | 5/2015 | Konishi | G02B 1/04 348/294 |
| 2015/0259547 | A1* | 9/2015 | Ezoe | C09D 201/00 257/432 |
| 2015/0293281 | A1* | 10/2015 | Ezoe | C09D 5/004 359/360 |
| 2017/0102483 | A1* | 4/2017 | Kawashima | G02B 1/04 |
| 2017/0263662 | A1* | 9/2017 | Hsieh | H01L 27/14621 |

FOREIGN PATENT DOCUMENTS

| | | |
|---|---|---|
| JP | 2004-200360 | 7/2004 |
| JP | 2006-337804 | 12/2006 |
| JP | 2007-019435 | 1/2007 |
| JP | 2007-141876 | 6/2007 |
| JP | 2007-242877 | 9/2007 |
| JP | 2007-277502 | 10/2007 |
| JP | 2008-305972 | 12/2008 |
| JP | 2011-176325 | 9/2011 |
| JP | 2012-064824 | 3/2012 |
| JP | 2012-140621 | 7/2012 |
| JP | 2013-155353 | 8/2013 |

* cited by examiner

IMAGE PICKUP DEVICE HAVING AN INFRARED ABSORPTION LAYER BETWEEN A LAMINATE BAND-PASS LAYER AND A LOW REFRACTIVE INDEX LAYER ABOVE ON-CHIP LENSES

TECHNICAL FIELD

The present technique relates to an image pickup device that removes infrared components from incident light entering the image pickup device.

BACKGROUND ART

Image pickup apparatuses such as a video camera and a digital still camera are used in photographing color images, and solid-state image pickup devices such as a CCD (Charge Coupled Device) and a CMOS (Complementary Metal Oxide Semiconductor) image sensor used in those cameras also have sensitivities with respect to a wavelength band from a rear-ultraviolet wavelength band to a near-infrared wavelength band.

In photographing color images, however, optical signals of wavelength bands excluding that corresponding to a visibility of human beings (wavelength of about 400 to 700 nm) become noise components with respect to correct color images when observations are made by human beings. In this regard, for obtaining correct color images, there is a need to detect signals from which light of a near-infrared wavelength band has been removed, by providing an infrared cut filter in a photoelectric conversion device of the solid-state image pickup device.

The infrared cut filter is generally provided between an image pickup optical system and the solid-state image pickup device, and an absorption-type infrared cut filler formed of a material that absorbs the infrared band or a reflection-type infrared cut filter that uses an interference of a multilayer film is used.

Incidentally, in recent years, while miniaturization of image pickup apparatuses is progressing, the infrared cut filter generally has a thickness of about 1 to 3 mm, and the thickness of the infrared cut filter is becoming a problem in the point of thinning of a digital camera. Particularly in a camera module equipped in a cellular phone, a mobile terminal apparatus, and fee like, thinning of an image pickup optical system is essential. In addition, since there is a need to mount the infrared cut filter in the image pickup apparatus together with the solid-state image pickup device, improvements are desired also in the point of production costs of the image pickup apparatus.

Here, Patent Document 1 discloses a solid-state image pickup device in which a flattening layer and on-chip lens having an infrared absorption ability are laminated on a photoelectric conversion device. Since the flattening film and on-chip lens have an infrared absorption ability, the infrared cut filter does not need to be provided in addition to the solid-state image pickup device, thus enabling the image pickup optical system to be thinned.

Further, Patent Document 2 discloses a solid-state image pickup device that removes infrared components by a color filter to which an infrared absorption material is added, the color filter being arranged on a photoelectric conversion device. This solid-state image pickup device also does not need to additionally include an infrared cut filter, thus enabling the image pickup optical system to be thinned.

Patent Document 1: Japanese Patent Application Laid-open No. 2004-200360

Patent Document 2: Japanese Patent Application Laid-open No. 2007-141876

SUMMARY OF INVENTION

Problems to be Solved by the Invention

However, the following problems arise in the solid-state image pickup devices described in Patent Documents 1 and 2. Specifically, when providing an infrared absorption ability to the on-chip lens and the color filter, thicknesses thereof become large, with the result that there is a fear that incident light with respect to the photoelectric conversion device will be optically influenced.

When adding an infrared absorption material to the on-chip lens and color filter, a certain amount of infrared absorption material is required for obtaining a sufficient infrared absorption ability. However, there is a limit in the concentration of the infrared absorption material since a large concentration of the infrared absorption material leads to a reduction of a visible light transmission amount. Therefore, there is no choice but to thicken the on-chip lens and color filter.

On the other hand, when the on-chip lens and color filter are thickened, a distance between a lens surface of the on-chip lens and the photoelectric conversion device becomes large. Accordingly, incident light that is to enter the on-chip lens provided on one photoelectric conversion device also enters the adjacent photoelectric conversion device, to cause deterioration of a pixel resolution or color separation.

Furthermore, when integrally providing an infrared absorption layer with the solid-state image pickup device, the infrared absorption layer needs to endure a temperature exceeding 180° C. considering the production and assembling steps unlike in the related art.

In the solid-state image pickup device as described in Patent Document 1, although there are descriptions on the materials having heat resistance exceeding 180° C., the infrared absorption intensity conditions as described above cannot be satisfied at the same time. Therefore, it is difficult to realize an on-chip lens thickness with which a sufficient infrared absorption ability can be obtained. Also in the solid-state image pickup device as described in Patent Document 2, it is difficult to perform the addition in terms of heat resistance of the material considering the heat resistance exceeding 180° C.

In addition, when integrally providing the infrared absorption layer with the solid-state image pickup device, heat deterioration of the infrared absorption layer becomes a problem. Specifically, since the infrared absorption layer is heated to about 80° C. to 180° C. when the solid-state image pickup device is used, it is necessary for the infrared absorption ability to not be impaired even when exposed to such temperatures for a long period of time.

In view of the circumstance as described above, the present technique aims at providing an image pickup device that has excellent durability and is capable of thinning an image pickup optical system without lowering image pickup performance.

Means for Solving the Problems

To attain the object described above, according to an embodiment of the present technique, there is provided an image pickup device including an on-chip lens, a low-refractive-index layer, and an infrared absorption layer.

The on-chip lens is formed of a high-refractive-index material.

The low-refractive-index layer is formed flat on the on-chip lens and formed of a low-refractive-index material.

The infrared absorption layer is formed of an infrared absorption material and laminated as a higher layer than the low-refractive-index layer, the infrared absorption material including an infrared absorption pigment and a binder resin, the binder resin being a synthetic resin constituted of a siloxane skeleton alone or a synthetic resin constituted of a siloxane skeleton part and a partial skeleton having a low reaction activity in an oxygen part.

With this structure, since the image pickup device includes the infrared absorption layer, there is no need to provide an infrared cut filter separate from the image pickup device, and thus the image pickup optical system can be thinned. Further, since the infrared absorption layer is laminated as a higher layer than the on-chip lens, the distance between the on-chip lens and the photoelectric conversion device (laminated as lower layer than on-chip leas) is equivalent to that in the case where the infrared absorption layer is not provided. If the distance between the on-chip lens and the photoelectric conversion device becomes large, there is a fear that incident light that is to enter the on-chip lens might enter the adjacent photoelectric conversion device to cause deterioration of image pickup performance. However, with the structure described above, the distance between the on-chip lens and the photoelectric conversion, device does not become large, and thus it is possible to prevent lowering of the image pickup performance as described above. Moreover, since the infrared absorption layer includes the binder resin having the structure described above, it is possible to prevent oxidization of the infrared absorption pigment due to the binder resin and suppress heat deterioration of the infrared, absorption layer. It should be noted that the infrared absorption material may also include an additive such as a pigment stabilizer and an antioxidant in addition to the infrared absorption pigment and the binder resin.

The infrared absorption material may have a heat yellowing temperature of 180° C. or more.

Unlike the case where an infrared absorption filter including an infrared, absorption pigment, is provided separate from the image pickup device, the image pickup device according to the present technique includes the infrared absorption layer. Here, the infrared absorption layer is sometimes exposed to high temperature during a production process of the image pickup device or while the image pickup device is operating. However, by using the infrared absorption material having a heat yellowing temperature of 180° C. or more, it becomes possible to prevent lowering of visible light transmittance of the infrared absorption layer due to heat.

The infrared absorption pigment may have a maximum absorption wavelength of 600 nm or more and 1200 nm or less and a molar absorption coefficient of 1000 L/mol·cm or more.

With this structure, the infrared absorption material including the infrared absorption pigment can effectively remove infrared components of the infrared wavelength band (600 nm or more and 1200 nm or less).

The infrared absorption pigment may include an anion part that has a larger size or formula weight or is more difficult to be oxidized than perchlorate ions and a cation part that has a larger size or formula weight or is more difficult to be oxidized than ammonium ions.

Pigments that can be formed into lakes can be used as the infrared absorption pigment but those pigments include an anion past or a cation part. By using a pigment including the anion part or the cation part as described above as the infrared absorption pigment, it is possible to prevent oxidization of the anion part or the cation part and prevent heat deterioration of the infrared absorption layer.

The image pickup device may further include a protection layer that is laminated on the infrared absorption layer and shields oxygen and moisture or suppresses a physical damage.

With this structure, the protection layer shields oxygen so that oxygen does not reach the infrared absorption layer. Accordingly, oxidation of the infrared absorption pigment included is the infrared absorption layer is prevented, and thus it becomes possible to prevent lowering of the infrared absorption ability due to the oxidization of the infrared absorption pigment. Moreover, since the protection layer shields moisture or suppresses a physical damage, deterioration of the infrared absorption layer can be prevented.

The image pickup device may further include a bandpass layer that is laminated as a higher layer than the low-refractive-index layer and is constituted of a multilayer film formed of a high-refractive-index material and a low-refractive-index material.

With this structure, it becomes possible to remove a part or all of purple light and light having a shorter wavelength than the purple light, or infrared light, or both of them in the bandpass layer. Since the bandpass layer uses interferences of light among the multilayers, the transmission, wavelength may sometimes shift depending on an incident angle of incident light. Even in such a case, the transmission wavelength band can be maintained by the infrared absorption layer in which the shift of the transmission wavelength does not occur in principle.

The image pickup device may further include aft antireflection layer that is laminated as a top layer and prevents reflection of light entering from an upper layer side and a lower layer side.

Incident light that enters the image pickup device may sometimes be slightly reflected by interfaces of the layers. If such, reflected light reaches the photoelectric conversion device of the image pickup device, light that is not the original imaging light enters the photoelectric conversion device to cause lowering of the image pickup performance. Here, by preventing re-reflection of the reflected light by the antireflection layer, lowering of the image pickup performance can be prevented.

The image pickup device may further include a color filter layer that is laminated as a lower layer than the on-chip lens.

With this structure, incident light from which infrared components have been removed by the infrared absorption layer becomes light of a predetermined wavelength, band (e.g., red, green, or blue) by a color filter provided in correspondence with the photoelectric conversion device and enters the photoelectric conversion device. In other words, color images can be taken by providing the color filter layer.

The image pickup device may further include a support substrate that supports the infrared absorption layer.

With this structure, it becomes possible to produce a structure in which the infrared absorption layer is laminated on the support substrate separate from the lower layer structure (photoelectric conversion layer, on-chip lens, low-refractive-index layer, etc.) and laminate it on the lower layer structure. In other words, it becomes possible to produce the lower layer structure and the infrared absorption layer in different production processes, thus leading to a productional advantage that existing facilities can be used, and the like.

The image pickup device may further include an adhesive layer that is formed of an adhesive material, and is laminated on the low-refractive-index layer.

With this structure, the support substrate on which the infrared absorption layer and the bandpass layer are laminated as described above can be laminated on the low-refractive-index layer via the adhesive layer. It should be noted that since the support substrate can be removed after adhesion, there are cases where the image pickup device does not include the support substrate.

To attain the object described above, according to an embodiment of the present technique, there is provided an image pickup device including an on-chip lens, a low-refractive-index layer, and an infrared absorption layer.

The on-chip lens is formed of a high-refractive-index material.

The low-refractive-index layer is formed flat on the on-chip lens and formed of a low-refractive-index material.

The infrared absorption layer is formed of an infrared absorption material and laminated as a higher layer than the low-refractive-index layer, the infrared absorption material including an infrared absorption pigment in a form of fine particles having a minor axis of 1 nm or more and a major axis of 50 nm or less.

With this structure, since the image pickup device includes the infrared absorption layer, there is no need to provide an infrared cut filter separate from the image pickup device, and thus the image pickup optical system can be thinned. Further, since the infrared absorption layer is laminated as a higher layer than the on-chip lens, the distance between the on-chip lens and the photoelectric conversion device (laminated as lower layer than on-chip lens) is equivalent to that in the case where the infrared absorption layer is not provided. If the distance between the on-chip lens and the photoelectric conversion device becomes large, there is a fear that incident light that is to enter the on-chip lens might enter tire adjacent photoelectric conversion device to ca use deterioration of image pickup performance. However, with the structure described above, the distance between the on-chip lens and the photoelectric conversion device does not become large, and thus it is possible to prevent lowering of the image pickup performance as described above. Further, since the infrared absorption pigment included in the infrared absorption layer is in the form of fine particles, it becomes possible to prevent oxidization of the infrared absorption pigment to suppress heat deterioration of the infrared absorption layer and prevent light scattering due to the infrared absorption pigment.

The infrared absorption material may include at least one of a binder resin, and an additive.

With this structure, a material obtained by mixing the infrared absorption pigment and the binder resin or additive can be used as the infrared absorption material. The binder resin is a resin in which the infrared absorption pigment is dispersed, and the additive is a pigment stabilizer, an antioxidant, or the like.

The infrared absorption pigment may have a maximum absorption wavelength of 600 nm or more and 1200 nm or less and a molar absorption coefficient of 1000 L/mol·cm or more.

With this structure, the infrared absorption material including the infrared absorption pigment can effectively remove infrared components of the infrared wavelength band (600 nm or more and 1200 nm or less).

The infrared, absorption pigment may include an anion part that has a larger size or formula weight or is more difficult to be oxidised than perchlorate ions and a cation part that has a larger size or formula weight or is more difficult to be oxidized than ammonium ions.

Pigments that can be formed into lakes can be used as the infrared absorption pigment, bat those pigments include an anion part or a cation part. By using a pigment including the anion part or the cation part as described above as the infrared absorption pigment, it is possible to prevent oxidization of the anion part or the cation part and prevent heat deterioration of the infrared absorption layer.

The image pickup device may further include a protection layer that is laminated on the infrared absorption layer and shields oxygen and moisture or suppresses a physical damage.

With this structure, the protection layer shields oxygen so that oxygen does not reach the infrared absorption layer. Accordingly, oxidation of the infrared absorption pigment included in the infrared absorption layer is prevented, and thus it becomes possible to prevent lowering of the infrared absorption ability due to the oxidization of the infrared absorption pigment. Moreover, since the protection layer shields moisture or suppresses a physical damage, deterioration of the infrared absorption layer can be prevented.

The image pickup device may further include a bandpass layer that is laminated as a higher layer than the low-refractive-index layer and is constituted of a multilayer film formed of a high-refractive-index material and a low-refractive-index material.

With this structure, it becomes possible to remove a part or all of purple light and light having a shorter wavelength than the purple light, or infrared light, or both of them in the bandpass layer. Since the bandpass layer uses interferences of light among the multilayers, the transmission wavelength may sometimes shift depending on an incident angle of incident light. Even in such a case, the transmission wavelength band can be maintained by the infrared absorption layer in which the shift of the transmission wavelength does not occur in principle.

The image pickup device may further include an antireflection layer that is laminated as a top layer and prevents reflection of light entering from an upper layer side and a lower layer side.

Incident light that enters the image pickup device may sometimes be slightly reflected by interfaces of the layers. If such reflected light reaches the photoelectric conversion device of the image pickup device, light that is not the original imaging light enters the photoelectric conversion device to cause lowering of the image pickup performance. Here, by preventing re-reflection of the reflected light by the antireflection layer, lowering of the image pickup performance can be prevented.

The image pickup device may further include a color filter layer that is laminated as a lower layer than the on-chip lens.

With this structure, incident light from which infrared components have been removed by the infrared absorption layer becomes light of a predetermined wavelength band (e.g., red, green, or blue) by a color filter provided in correspondence with the photoelectric conversion device and enters the photoelectric conversion device. In other words, color images can be taken by pro viding the color filter layer.

The image pickup device may further include a support substrate that supports the infrared absorption layer.

With this structure, it becomes possible to produce a structure in which the infrared absorption layer is laminated on fee support substrate separate from the lower layer structure (photoelectric conversion layer, on-chip lens, low-refractive-index layer, etc.) and laminate it on the lower layer structure. In other words, it becomes possible to produce the lower layer structure and the infrared absorption layer m different production processes, thus leading to a productional advantage that existing facilities can be used, and the like.

The image pickup device may further include an adhesive layer that is formed of an adhesive material and is laminated on the low-refractive-index layer.

With this structure, the support substrate on which the infrared absorption layer and the bandpass layer are laminated as described above can be laminated on the low-refractive-index layer via the adhesive layer. It should be noted that since the support substrate can be removed after adhesion, there are cases where the image pickup device does not include the support substrate.

Effects of the Invention

As described above, according to the present technique, an image pickup device that has excellent durability and is capable of thinning an image pickup optical system without lowering image pickup performance can be provided.

MODES FOR CARRYING OUT THE INVENTION

First Embodiment

An image pickup device according to a first embodiment, of the present technique will be described. The image pickup device of this embodiment can be mounted on an image pickup apparatus (camera etc.) together with an image pickup optical system that images an object on the image pickup device.

[Structure of Image Pickup Device]

Figure 1:
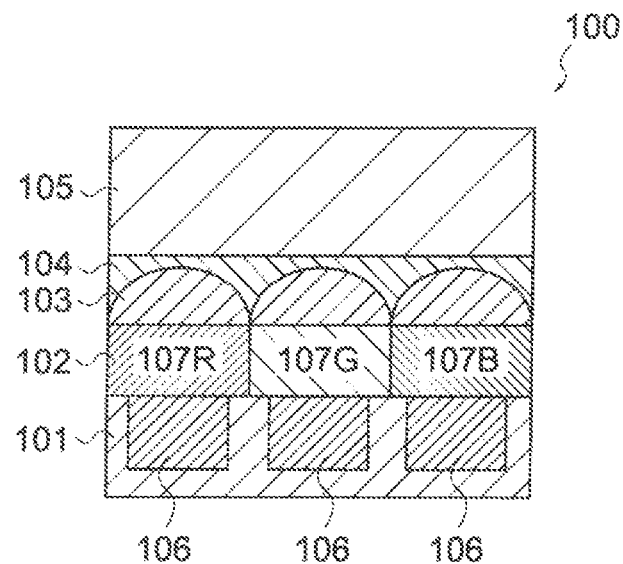
FIG. 1 A schematic diagram of an image pickup device according to a first embodiment of the present technique.

FIG. 1 is a schematic diagram of an image pickup device 100 of this embodiment. As shown in the figure, the image pickup device 100 is formed by laminating a photoelectric conversion layer 101, a color filter layer 102, on-chip lenses 103, a low-refractive-index layer 104, and an infrared, absorption layer 105.

The photoelectric conversion layer 101 is a layer including a plurality of photoelectric conversion devices 106. Specifically, the photoelectric conversion layer 101 can be formed by laminating circuits of the photoelectric conversion devices 106 on a substrate formed of silicon and the like. The structure of the photoelectric conversion layer 101 may be a CCD (Charge Coupled Device) structure or a CMOS (Complementary Metal Oxide Semiconductor).

The photoelectric conversion layer 101 may be an image sensor in which the photoelectric conversion devices 106 are arranged two-dimensionally (in array) or a line sensor in which the photoelectric conversion devices 106 are arranged one-dimensionally (linearly).

The color filter layer 102 is laminated on the photoelectric conversion layer 101 and includes color filters respectively corresponding to the photoelectric conversion devices 106. Specifically, the color filters are three types of color filters, that is, a red color filter 107R that transmits a red wavelength band, a green color filter 107G that transmits a green wavelength band, and a blue color filter 107B that transmits a blue wavelength band. Hereinafter, the red color filter 107R, the green color filter 107G, and the blue color filter 107B will collectively be referred to as color filters 107.

The types (transmission wavelengths) of color filters 107 are not limited to the three colors above. The material of each color filter 107 is not limited in particular, and the color filter 107 can be formed of a known material. As shown in FIG. 1, the color filter 107 having any of the three types of transmission wavelengths is provided above the corresponding photoelectric conversion device 106. Accordingly, light having a specific wavelength band, that has been transmitted through the color filter 107 as the upper layer, enters the photoelectric conversion device 106, and an output thereof can be used as an intensity of light of the wavelength band that has been transmitted through the color filter 107.

It should be noted that the color filter layer 102 does not need to be provided. When the color filter layer 102 is not provided, a monochrome image is generated from the outputs of the respective photoelectric conversion devices 106. In this case, the on-chip lenses 103 may be provided above the photoelectric conversion layer 101 or provided via some kind of a layer.

The on-chip lenses 103 are formed on the color filter layer 102 and collect incident light at the photoelectric conversion devices 106 via the color filters 107. The on-chip lenses 103 may be formed in correspondence with the respective photoelectric conversion devices 106 as shown in FIG. 1, or one on-chip lens 103 may be formed with respect to the plurality of photoelectric conversion devices 106.

The on-chip lenses 103 are each formed of a high-refractive-index material having optical transparency and formed in a hemisphere or a shape that functions as a lens. Accordingly, light that enters the on-chip lenses 103 from tire low-refractive-index layer 104 having a smaller refractive index than, the on-chip lenses 103 is refracted by the interface between the low-refractive-index layer 104 and the on-chip lenses 103 to be collected at the photoelectric conversion devices 106 respectively corresponding to the on-chip lenses 103.

The low-refractive-index layer 104 is formed flat on the on-chip lenses 103. In other words, the lens shapes (hemispheres etc.) of the on-chip lenses 103 are buried in the low-refractive-index layer 104. The low-refractive-index layer 104 may be formed of a material that has optical transparency and a smaller refractive index than at least the on-chip lenses 103. It should be noted that as a difference she refractive indexes increases between the low-refractive-index layer 104 and the on-chip lenses 103, a lens effect of the on-chip lenses 103 increases, which is favorable.

The infrared absorption layer 105 is laminated on the low-refractive-index layer 104 and removes infrared components from incident light entering the image pickup device 100. Since the low-refractive-index layer 104 is formed flat as described above, the infrared absorption layer 105 can be laminated with a certain thickness irrespective of the shape of the on-chip lenses 103. It is favorable for the infrared absorption layer 105 to be formed of a material having a high infrared component absorption rate and high visible light transmittance, the details of which will be described later.

The thickness of the infrared absorption layer 105 is favorably 1 µm or more and 200 µm or less. In the image pickup device 100 of this embodiment since the thickness of the infrared absorption layer 105 does not influence a distance between the on-chip lenses 103 and the photoelectric conversion devices 106, the infrared absorption layer 105 can be formed in a sufficient thickness requisite for removing infrared components.

[Operation of Image Pickup Device]

Figure 2:
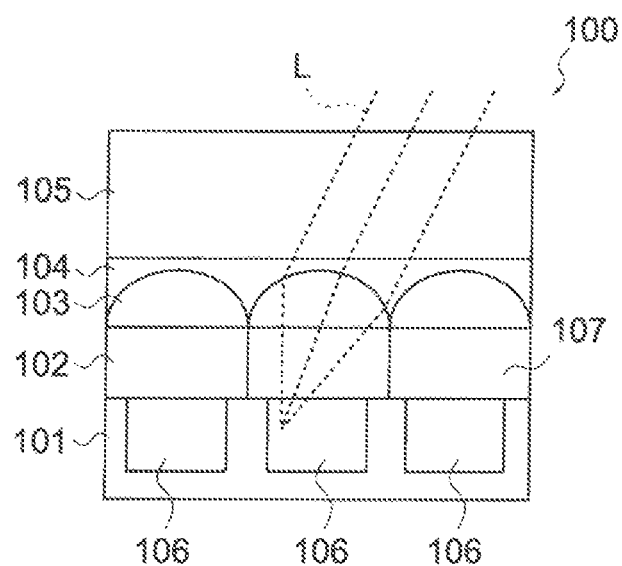
FIG. 2 A schematic diagram showing an operation of the image pickup device.

Operations of the image pickup device 100 having the structure described above will be described. FIG. 2 is a schematic diagram showing incident light (indicated as incident light L) entering the image pickup device 100. As shown in the figure, the incident light L is transmitted through the infrared absorption layer 105, the low-refractive-index layer 104, the on-chip lenses 103, and the color filter layer 102 and reaches the photoelectric conversion devices 106.

Components of the infrared wavelength band (hereinafter, referred to as infrared components) included in the incident light L are removed by the infrared absorption layer 105, and the incident light L is refracted by the interface between the low-refractive-index layer 104 and the on-chip lenses 103 to be collected toward the photoelectric conversion devices 106. Components of wavelength bands other than the transmission wavelength bands of the color filters 107 are removed by the color filter layer 102, and the incident light L is photoelectrically converted by the photoelectric conversion devices 106.

[Effects of Image Pickup Device]

Figure 3:
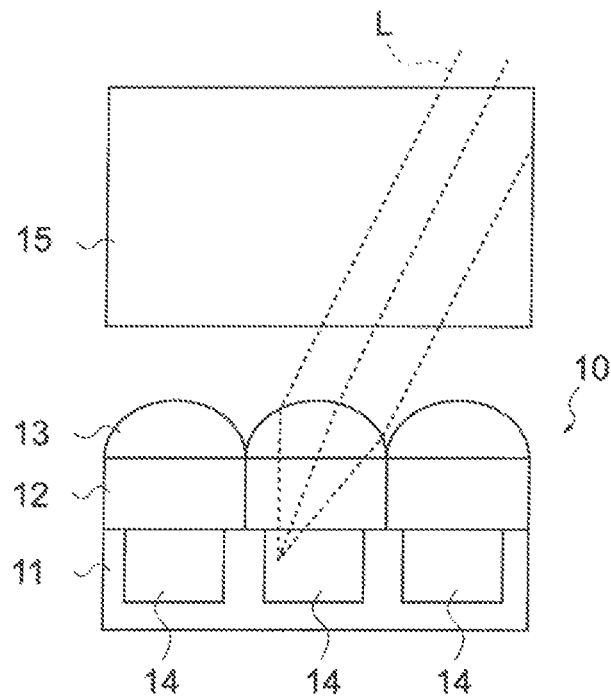
FIG. 3 A schematic diagram showing an operation of an image pickup device according to a comparative example.
Figure 4:
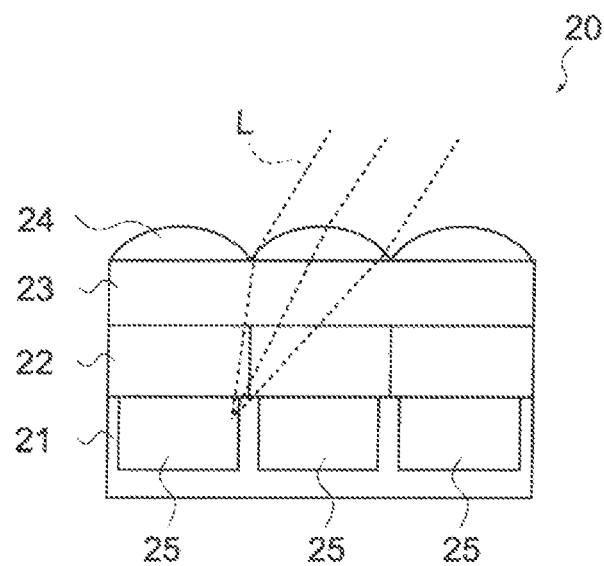
FIG. 4 A schematic diagram showing an operation of an image pickup device according to a comparative example.
Figure 5:
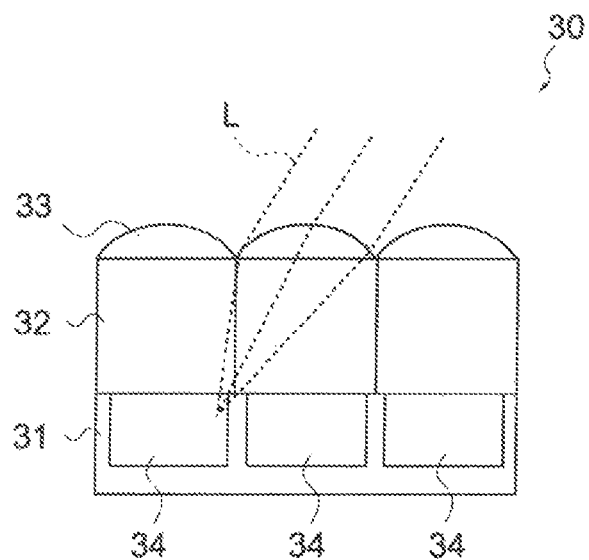
FIG. 5 A schematic diagram showing an operation of an image pickup device according to a comparative example.

Effects of the image pickup device 100 of this embodiment will be described while comparing it with those of comparative examples. FIGS. 3 to 5 are schematic diagrams showing image pickup devices of the related art as the comparative examples.

FIG. 3 is a schematic diagram showing an image pickup device 10 according to a comparative example. The image pickup device 10 is formed by laminating a photoelectric conversion layer 11, a color filter layer 12, and on-chip lenses 13 in the stated order. A plurality of photoelectric conversion devices 14 are formed in the photoelectric conversion layer 11. As shown in the figure, since the image pickup device 10 cannot prevent entering of infrared components with respect to the photoelectric conversion devices 14 alone, the image pickup device 10 needs to be mounted on an image pickup apparatus (not shown) together with an infrared-cut filter 15. The infrared cut filter 15 may be an infrared absorption filter formed of an infrared absorption material or a multilayer filter in which a high-refractive-index material and a low-refractive-index material are alternately laminated a large number of times.

As shown in FIG. 3, the incident light L is transmitted through the infrared cut filter 15 to enter the image pickup device 10 and is transmitted through the on-chip lenses 13 and the color filter layer 12 to reach the photoelectric conversion devices 14. Here, while the infrared cut filter 15 needs to be mounted on the image pickup apparatus separate from the image pickup device 10 as described above, the infrared cut filter 15 needs to have a certain thickness (about 1 to 3 mm) for maintaining an intensity or the like. Therefore, thinning of the image pickup optical system becomes difficult due to the infrared cut filter 15.

In contrast, in the image pickup device 100 of this embodiment shown in FIG. 2, since the infested components of the incident light L are removed by the infrared absorption layer 105, the infrared cut filter does not need to be provided in addition to the image pickup device 100, thus enabling the image pickup optical system to be thinned.

Further, FIGS. 4 and 5 are schematic diagrams each showing an image pickup device according to another comparative example.

An image pickup device 20 according to the comparative example shown in FIG. 4 (corresponding to Patent Document 1 of prior art) is formed by laminating a photoelectric conversion layer 21, a color filter layer 22, an infrared absorption layer 23, and on-chip lenses 24 in the stated order. A plurality of photoelectric conversion devices 25 are formed in the photoelectric conversion layer 21. The infrared absorption layer 23 is a layer formed of an infrared absorption material.

Since the image pickup device 20 includes the infrared absorption layer 23, an infrared cut filter independent from the image pickup device 20 is not necessary unlike the image pickup device 10, and thinning of the image pickup optical system becomes possible. However, there arise the following problems with the structure of the image pickup device 20.

As shown in FIG. 4, the incident light L is collected by the on-chip lenses 24, transmitted through the infrared absorption layer 23 and the color filter layer 22, and reaches the photoelectric conversion devices 25. Here, by the infrared, absorption layer 23 present between the on-chip lenses 24 and the color filter layer 22, a distance between the on-chip lenses 24 and the photoelectric conversion devices 25 becomes large. This is because a certain thickness is required for obtaining a sufficient infrared absorption ability. Here, since a distance between the on-chip lenses 24 and the photoelectric conversion devices 25 becomes large, a lens curvature of the on-chip lenses 24 is adjusted so that light is collected right at the positions of the photoelectric conversion devices 25.

Accordingly, the incident light L that has entered a certain on-chip lens 24 with an angle may enter an adjacent photoelectric convention device 25 instead of the photoelectric conversion device 25 corresponding to that on-chip lens 24 as shown in FIG. 4. As a result, deterioration of a pixel resolution or color separation occurs.

An image pickup device 30 according to the comparative example shown in FIG. 5 (corresponding to Patent Document 2 of prior art) is formed by laminating a photoelectric conversion layer 31, a color filter/infrared absorption layer 32, and on-chip lenses 33 in the stated order. A plurality of photoelectric con version devices 34 are formed m the photoelectric conversion layer 31. The color filter/infrared absorption layer 32 is a layer having both the color filter function and the infrared absorption function.

Since the image pickup device 30 also includes the color filter/infrared absorption layer 32, an infrared cut filter independent from the image pickup device 30 is not necessary like the image pickup device 20, and thinning of the image pickup optical system becomes possible. However, the color filter/infrared absorption layer 32 also requires a certain thickness for obtaining a sufficient infrared absorption ability. Therefore, similar to the case of the image pickup device 20, there arises a problem that incident light entering a certain on-chip lens 33 may enter an adjacent photoelectric conversion device 34 instead of the photoelectric conversion device 34 corresponding to that on-chip lens 33. Here, since a distance between the on-chip lenses 33 and the photoelectric conversion devices 34 becomes large, a lens curvature of the on-chip lenses 33 is adjusted so that light is collected right at the positions of the photoelectric conversion devices 34.

In contrast, in the image pickup device 100 of this embodiment shown in FIG. 2, the infrared absorption layer 105 is formed above fee on-chip lenses 103. In other words, the distance between the on-chip lenses 103 and the photoelectric conversion devices 106 is comparable with that of the related art structure (see image pickup device 10 in FIG. 3) irrespective of the thickness of the infrared absorption layer 105, and a problem that the incident light L enters the adjacent photoelectric conversion device 106 does not occur unlike the image pickup device 20 and image pickup device 30 of the comparative examples. In other words, in the image pickup device 100 of this embodiment, the image pickup optical system can be thinned without lowering the image pickup performance (resolution etc.) of the image-pickup device 100.

[Regarding Infrared Absorption Material]

As described above, the infrared absorption layer 105 of the image pickup device 100 is formed of an Infrared absorption, material having &n infrared absorption ability. It is favorable for the infrared absorption material constituting the infrared absorption layer 105 to have a heat yellowing temperature (temperature at which infrared absorption material deteriorates and becomes yellow) of 180° C. or more. This is because the infrared absorption layer 105 is included in the image pickup device 100 unlike the case where the infrared cut filter 15 is provided separate from the image pickup device 10 like the image pickup device 10 according to the comparative example. In other words, a material in which yellowing does not occur even when the infrared absorption layer 105 is exposed to high temperature during a production process of the image pickup device 100 or while the image pickup device is operating is favorable as the infrared absorption material.

The infrared absorption material may include at least an infrared absorption pigment (wavelength selectivity absorption pigment), and the infrared absorption pigment can be mixed with a binder resin to obtain the infrared absorption material. Alternatively, the infrared absorption material may include an additive (leveling agent, dispersant, etc.).

(Infrared Absorption Pigment)

As the infrared absorption pigment, a pigment having a maximum absorption wavelength of 600 nm or more and 1200 nm or less and a molar absorption coefficient of 1000 L/mol·cm or more is favorable. In addition, for securing visible area permeability, it is desirable for a ratio of the molar absorption coefficient of the maximum absorption wavelength of the infrared area and visible area of the pigment to be 0.1 or less.

It is favorable for the infrared absorption pigment to be in a form of fine particles having a minor axis of 1 nm or more and a major axis of 50 nm or less. When the minor axis is smaller than 1 nm, a surface area of the infrared absorption pigment becomes large, and the infrared absorption pigment becomes easier to be oxidized. While the image pickup device 100 is used, the inferred absorption layer 105 is heated to about 80° C. to 180° C. As the infrared absorption pigment is oxidized by the heating, the infrared absorption ability of the infrared absorption layer 105 is impaired. In this regard, by setting the minor axis of the infrared absorption pigment to be 1 nm or more, it becomes possible to prevent oxidization of the infrared absorption pigment and suppress beat deterioration of the infrared absorption layer 105.

Further, when the major axis of fee infrared absorption pigment exceeds 50 nm, light scattering due to the infrared absorption pigment occurs, and there is a fear that a reduction of a light reception amount occurs or noises are caused in the photoelectric conversion devices 14. In this regard, by setting the major axis of the infrared absorption pigment to be smaller than 50 nm, light scattering due to the infrared absorption pigment can be prevented.

In other words, by using the infrared absorption pigment, in a form of fine particles having a minor axis of 1 nm or more and a major axis of 50 nm or less, heat deterioration of the infrared absorption pigment and light scattering due to the infrared absorption pigment can be prevented from occurring. The fine particles of fee infrared absorption pigment in the size described above can be produced by a grinding method that uses a kneader or a rocking mill or a recrystallization method, and the infrared absorption pigment in the form of fine particles may be produced by either of the methods.

It should be noted that when forming fine particles is general, reaggregation of fine particles becomes a problem. As a countermeasure for this, there are an addition of a surfactant, surface processing on fine particles (rosin, resin processing), pigment derivatization processing, and the like, and any of the methods may be used to form fine particles of the infrared absorption pigment. The additive to be used in the processing process will, be described later.

Furthermore, it is favorable for the infrared absorption pigment to have a decomposition temperature of 180° C. or more. This is because it is necessary to prevent the infrared absorption ability from being lost due to the exposure of the infrared absorption layer 105 to high temperature during the production process of the image pickup device 100 or while the image pickup device 100 is operating as described above. It should be noted that it is also possible to raise fee decomposition temperature of the infrared-absorption, pigment by the additive to be described later. The infrared absorption pigment included in the infrared absorption material may be of two types or more, or a combination of the infrared absorption, pigments with which spectroscopic characteristics suited for image pickup are obtained may be selected as appropriate.

Specifically, the infrared absorption pigment is a pigment including, as a main backbone, a dithiol complex, an aminothiol complex, an azo complex, phthalocyanine, naphthalocyanine, a phosphoester copper complex, a nitroso compound, and a metal complex thereof. The metal part of the complex can be selected from iron, magnesium, nickel, cobalt, copper, vanadium, zinc, palladium, platinum, titanium, indium, tin, chromium, scandium, manganese, and the like, and oxides such as titanyl and vanadyl can also be selected. Moreover, as the Coordination part element, an organic ligand including regions of various halogens, an amine group, a nitro group, and a thiol group can be selected. Furthermore, substituent groups such as an alkyl group, a hydroxyl group, a carboxyl group, an amino group, a nitro group, a cyano group, an alkyl fluoride group, and ether may also be introduced.

Further, as the infrared absorption, pigment, there are methine dyes such as cyanine and merocyaoine and organic compounds such, as triarylmethane, squarylium, anthraqainone, naphthoquinone, quatenylene, petylene, thrythil, immomum, diimrnonmm, croconium, oxanol, amkiuro salt, a pyrrolopyrrole derivative, a qukone derivative, and a dye lake. Substituent groups such as an alkyl group, a hydroxyl group, a carboxyl group, an amino group, a nitro group, a cyano group, an alkyl fluoride group, and ether may also be introduced into each of the compounds.

Further, as the infrared absorption pigment, there are metal oxides such as ITO (Indium Tin Oxide), AZO (Al doped Zinc Oxide), a tungsten oxide, an antimony oxide, cesium tungsten, and an iron oxide. Those metal oxides may each be in a form of a film or a particle-type motionless body.

Furthermore, as the infrared absorption pigment, a material including an anion part that has a larger size or formula weight or is more difficult to be oxidized than perchlorate ions and a cation part that has a larger size or formula weight or is more difficult to be oxidized than ammonium ions can be used. As the infrared absorption pigment, pigments that can be formed into lakes, such as a methine dye and diimmonium, can be used, but those pigments include an anion pastor cation part.

Examples of the anion that has a larger size or formula weight or is more difficult to be oxidized than perchlorate ions include peroxide anions such as a perbromic acid anion and a periodic acid anion, fluoride anions such as a hexafluorophosphate anion, a hexafluoroantimony anion, and a hexafluorobismuth anion, an alkyl sulfonic acid anion derivative, tosylate, an alkylsulfonylimide anion derivative, a cyan-based anion, a boron-based anion typified by tetraphenylborate, saccharinate, and acesulfamate. Examples of the cation that has a larger size or formula weight or is more difficult to be oxidized than ammonium ions include an ammonium cation derivative, an imidazolines, derivative, a pyridinium derivative, a pyrrolidinium derivative, a phosphonium derivative, and a sulfonium derivative.

In the infrared absorption pigment including those anion parts or cation parts, the anion parts or cation parts are difficult to be oxidized. Therefore, it is possible to prevent oxidization of the infrared absorption pigment due to the heating of the infrared absorption layer 105 at the time the image pickup device 100 is used and prevent heat deterioration of the infrared absorption layer 105.

(Binder Resin)

The hinder resin may be a high-molecular-weight body or a low-molecular-weight body, in the case of a high-molecular-weight body, it is favorable for the decomposition temperature to be 180° C. or more and Tg (glass-transition temperature) to be 180° C. or more, and more favorable for Mp (melting point) to be 180° C. or more. Further, it is most favorable for the heat yellowing temperature to be 180° C. or more. Accordingly, it becomes possible to prevent lowering of the infrared absorption ability of the infrared absorption material and lowering of visible light permeability.

In the case of a low-molecular-weight body, it is favorable for a high-molecular-weight body generated after a cross-linking reaction by post-deposition heating, irradiation of ultraviolet rays, and the like to have a decomposition temperature of 180° C. or more and Tg of 180° C. or mote, more favorably Mp of 180° C. or more. Further, it is most favorable for the heat yellowing temperature to be 180° C. or more. Accordingly, it becomes possible to prevent lowering of the infrared absorption ability of the infrared absorption material, and lowering of visible light permeability.

Moreover, there are cases where a cross-linker, an initiator (e.g., photopolymerization initiator or thermal polymerization initiator), or the like that can be used as a reaction auxiliary agent becomes necessary when a cross-linking reaction is necessary. Those reaction auxiliary agents are selected as appropriate based on the low-molecular-weight body (monomer) to be used, but it is favorable for all of the high-molecular-weight body, the low-molecular-weight body, and the reaction auxiliary agent to not have a maximum absorption wavelength within, the range of 400 to 600 nm (visible light wavelength band).

Even when the heat yellowing temperature of the binder resin is smaller than 180° C., oxide fine particles may be mixed in the resin so as to improve the heat yellowing property. It should be noted that the oxide fine particles correspond to the additive to be described later.

Specifically, as the binder resin, there are resins including epoxy, acryl, and vinyl at terminal structures thereof. In addition, resins including, in main chain skeletons thereof, silicone, polycarbonate, polyethylene sulfone, polyimide, norbornene, other multifunctional polymers (desirably three or more functions), a polysaccharide structure, or a cellulose structure have a high beat yellowing property and are thus favorable.

Further, as the binder resin, a resin in which the infrared absorption pigment is difficult to be oxidized is favorable.

Specifically, a synthetic resin constituted of a siloxane skeleton alone or a synthetic resin constituted of a siloxane skeleton part and a partial skeleton having a low reaction activity in an oxygen part can be used as the binder resin. An example of the organic group having a high reaction activity in the oxygen part is a carbonyl group, and examples of the organic group having a low reaction activity in the oxygen part include ether, a vinyl group, amine, and an alkyl group. Therefore, a siloxane polymer constituted of a siloxane skeleton alone, silicone constituted of a siloxane skeleton and an organic group having a low reaction activity in the oxygen part, and the like can be used as the binder resin. The polymer resin may be mixed or copolymerized, or a graft copolymer constituted of an epoxy polymer and dimethylpolysiloxane may be used, for example. It should be noted that a resin having high visible area transparency is particularly favorable out of those resins.

Assuming that a resin including an organic group having a high reaction activity in the oxygen part is used as the binder resin, oxygen of the organic group is imparted to the infrared absorption pigment due to heating of the infrared absorption layer 105 at the time the image pickup device 100 is used, and the infrared absorption pigment is oxidized. Accordingly, the infrared absorption ability of the infrared absorption layer 105 is impaired. By using a synthetic resin constituted of a siloxane skeleton alone or a synthetic resin constituted of a siloxane skeleton part and a part not including die organic group having a high reaction activity in the oxygen part as the binder resin, it is possible to prevent oxidization of the infrared absorption pigment due to the binder resin and prevent heat deterioration of the infrared absorption ability of the infrared absorption layer 105.

(Additive)

As the additive, there are a leveling agent, a dispersant (surfactant etc.), an antioxidant, a pigment stabilizer, and the like. It is favorable for those additives to not have a maximum absorption wavelength within the visible light wavelength band of 400 to 600 nm. Further, an additive having a decomposition temperature of 180° C. or more is favorable. In a case where the pigment stabilizer or antioxidant for the infrared absorption pigment is used in particular, even when the decomposition temperature of the infrared absorption pigment and the binder resin is 180° C. or less, the heat yellowing temperature of the infrared absorption material may become 180° C. or more due to those additives. In such a case, the decomposition temperature of the infrared absorption pigment and the binder resin does not necessarily need to be 180° C. or more.

Further, light deterioration sometimes becomes a problem depending on the infrared absorption pigment and binder resin to be used. When such light resistance becomes a problem, an additive that suppresses light deterioration may be used. As the additive that suppresses light deterioration, there are an additive that, suppresses singlet oxygen and a stabilizer for an excitation pigment. Examples of the light stabilizer include metal complexes such as a nickel dithiol complex, a nickel complex, a copper thiol complex, and a cobalt: thiol complex, light stabilizers such as a TCNQ (tetracyanoquinodimethane) derivative, a phenol system, a phosphor system, a hindered amine system, and an anthracene derivative, and metal oxide fine particles of copper oxide, iron oxide, and the like. The additive is not limited in particular as long as it is within those described above, but an additive that does not change heat resistance of the infrared absorption pigment or optical characteristics is more desirable.

Furthermore, when the infrared absorption pigment is used in the form of fine particles as described above, a surfactant may be added for suppressing reaggregation of the particles. The surfactant is selected as appropriate according to the surface condition of the infrared absorption pigment included in the infrared absorption layer 105, and a substance that is capable of exerting a function of favorably dispersing a pigment in a resin composition and shows no absorption in a visible area is desirable.

The surfactant is roughly categorized into that whose hydrophilic region is ionic (cationic, anionic, geminous) and that whose hydrophilic region is non-ionic (nonionic). Further, the surfactant is categorized into a low-molecular type and a high-molecular type based on a molar weight thereof. As a dispersant, that becomes an anion when disassociated in water, a substance having, as a hydrophilic group, a carboxylic acid, sulfonic acid, or phosphoric acid structure is known. Specifically, there are a soap (fatty acid sodium), monoalkyl hydrosulfate, alkyl polyoxyethylene hydrosulfate, alkyl benzene sulfonate, and monoalkyl phosphate. Moreover, a dispersant that becomes a cation when disassociated in water is also known.

There is a cation-based surfactant (cationic surfactant) that has tetraalkyl ammonium as the hydrophilic group. Specifically, there are alkyl trimethyl ammonium salt, dialkyl dimethyl ammonium salt, and alkylbenzyl dimethyl ammonium salt. Furthermore, there is also known an amphoteric surfactant (geminate surfactant) that has both the anionic region and the cationic region in a molecule and becomes a cation/amphoteric ion/anion based on pH of a solution, the amphoteric surfactant having a structure obtained by combining those described above. Specifically, there are alkyl dimethylamine oxide and alkyl carboxybetaine.

On the other hand, a non-ionic surfactant (nonionic surfactant) of a low-molecular substance such, as alkyl glycoside, a polyalcohol ester system, and a higher alcohol alkylene oxide system, that has a non-electrolytic hydrophilic part, that is, a hydrophilic part that is not ionized, is known. Specifically, there are fatty acid sorbitan ester, alkyl polyglucoside, fatty acid diethanolamide, and alkyl monoglyceryl ether.

As a high-molecular dispersant, there are, for example, polycarboxylic-based, naphthalene sulfonate formalin condensation-based, and polycarboxylic alkylester-based anionic dispersants, a polyalkylene polyamine-based cationic dispersant, and polyethylene glycol-based, polyvinyl alcohol-based, and polyether-based non-ionic (nonionic) dispersants. Of those, it is desirable to add a high-molecular surfactant with which a reduction of bleed and the like is unlikely to occur.

As described above, the infrared absorption material to become the infrared absorption layer 105 can be constituted of the infrared absorption pigment, the binder resin, and an additive to be arbitrarily added thereto. It should be noted that the infrared absorption layer 105 needs to be in close contact with the low-refractive-index layer 104 as the lower layer while having sufficient adhesiveness, and cracks, white turbidity, peeling, and the like should not be caused due to besting. The adhesiveness of the infrared absorption layer 105 depends on, in the case of the infrared absorption pigment alone, the adhesiveness of the pigment material and depends on, in the case where the binder resin becomes a main component of the infrared absorption material, the adhesiveness of the binder resin. Further, when sufficient adhesiveness cannot be obtained by the infrared absorption, pigment or the binder resin, the adhesiveness may be improved by using an additive.

The infrared absorption layer 105 can be formed by depositing the infrared absorption material described above on the low-refractive-index layer 104 by a deposition method such as a vapor deposition method, a sputtering method, and an application method. In particular, a deposition method with which the infrared absorption layer 105 can be formed with a uniform thickness is favorable.

[Regarding Combination with Infrared Cut Filter]

Figure 6:
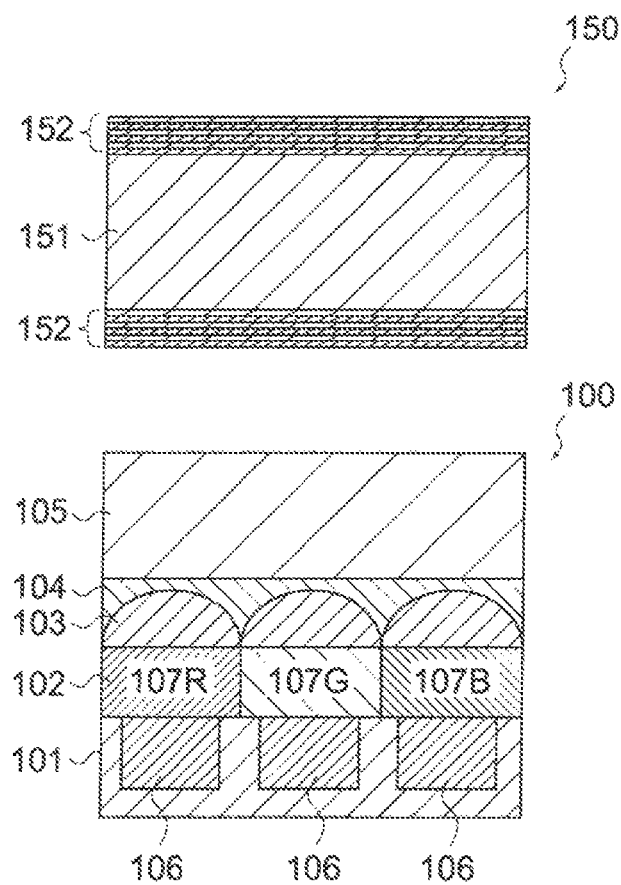
FIG. 6 A schematic diagram showing the image pickup device according to the first embodiment of the present technique and an infrared cut filter.

The image pickup device 100 of this embodiment can be used with an infrared cut filter. FIG. 6 is a schematic diagram showing an infrared cut filter 150 mounted with the image pickup device 100. As shown in the figure, the infrared cut filter 150 may be a multilayer infrared cut filter.

Specifically, as the infrared cut filter 150, a filter obtained by depositing multilayer films 152 on both surfaces of a support substrate 151 is used. The multilayer films 152 are each obtained by alternately laminating a layer formed of a high-refractive-index material and a layer formed of a low-refractive-index material, and only the infrared components are reflected by interferences of light at the interlayers so as to transmit visible light. It should be noted that the infrared cut filter 150 is not limited to the multilayer infrared cut filter and may be those capable of removing infrared components based on other principles.

By using the image pickup device 100 together with the infrared cut filter 150, it becomes possible to mutually compensate for the transmission wavelength bands between the infrared, absorption layer 105 of the image pickup device 100 and the infrared cut filter 150 (to be described later). Moreover, since the infrared removal amount can be divided by those two, the infrared absorption layer 105 can be thinned.

Second Embodiment

An image pickup device according to a second embodiment of the present technique will be described. The image pickup device of this embodiment can be mounted on an image pickup apparatus (camera etc.) together with an image pickup optical system that images an object on the image pickup device.

[Structure of Image Pickup Device]

Figure 7:
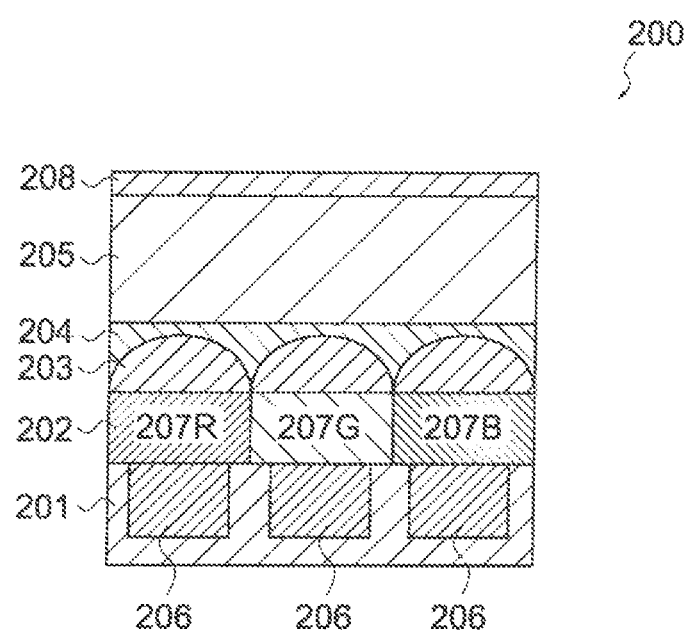
FIG. 7 A schematic diagram of an image pickup de vice according to a second embodiment of the present technique.

FIG. 7 is a schematic diagram showing the image pickup device 200 of this embodiment. As shown in the figure, the image pickup device 200 is formed by laminating a photoelectric conversion layer 201, a color filter layer 202, on-chip, lenses 203, a low-refractive-index layer 204, an infrared absorption layer 205, and an antireflection layer 208.

The photoelectric conversion layer 201, the color filter layer 202, the on-chip lenses 203, the low-refractive-index layer 204, and the infrared absorption layer 205 have structures similar to those of the first embodiment. A plurality of photoelectric conversion devices 206 are formed in the photoelectric conversion layer 201. The color filter layer 202 includes a red color filter 207R, a green color filter 207G, and a blue color filter 207B (hereinafter, collectively referred to as color filters 207) respectively corresponding to the photoelectric conversion devices 206.

The antireflection layer 208 is laminated on the infrared absorption layer 205 as a top layer of the image pickup device 200 and prevents reflection, of incident light from the upper side and incident light from the lower side (infrared absorption layer 205). The incident light entering the image pickup device 200 is transmitted through the antireflection layer 208, the infrared absorption layer 205, and the low-refractive-index layer 204, collected by the on-chip lenses 203, transmitted through the color filter layer 202, and reaches the photoelectric conversion devices 206. Here, part of the incident light may be reflected by the interfaces, of the layers so that the reflected light advances toward the upper layer side.

If the antireflection layer 208 is not provided, the reflected light from the lower layer side is reflected again by an interlace between the infrared absorption layer 205 and air to enter another photoelectric conversion device 206, thus causing lowering of the pixel, resolution and the like. Here, by preventing re-reflection of the reflected light at the interface between air and the infrared absorption layer 205 by the antireflection layer 208, it becomes possible to prevent the reflected light from reaching another photoelectric conversion device 206.

The antireflection layer 208 can be formed of an arbitrary material that lowers optical reflectance at the interface between air and the infrared absorption layer 205, It is also possible to form the antireflection layer 208 of a material capable of shielding oxygen so that oxygen is prevented from reaching the infrared absorption layer 205, and oxidisation of the infrared absorption pigment included in the infrared absorption layer 205 is prevented. It is also possible to form the antireflection layer 208 of a material having a physically or chemically high intensity to prevent physical or chemical damages of the lower layers.

Third Embodiment

An image pickup device according to a third embodiment of the present technique will be described. The image pickup device of this embodiment can be mourned on an image pickup apparatus (camera etc.) together with an image pickup optical system that images an object on tire image pickup device.

[Structure of Image Pickup Device]

Figure 8:
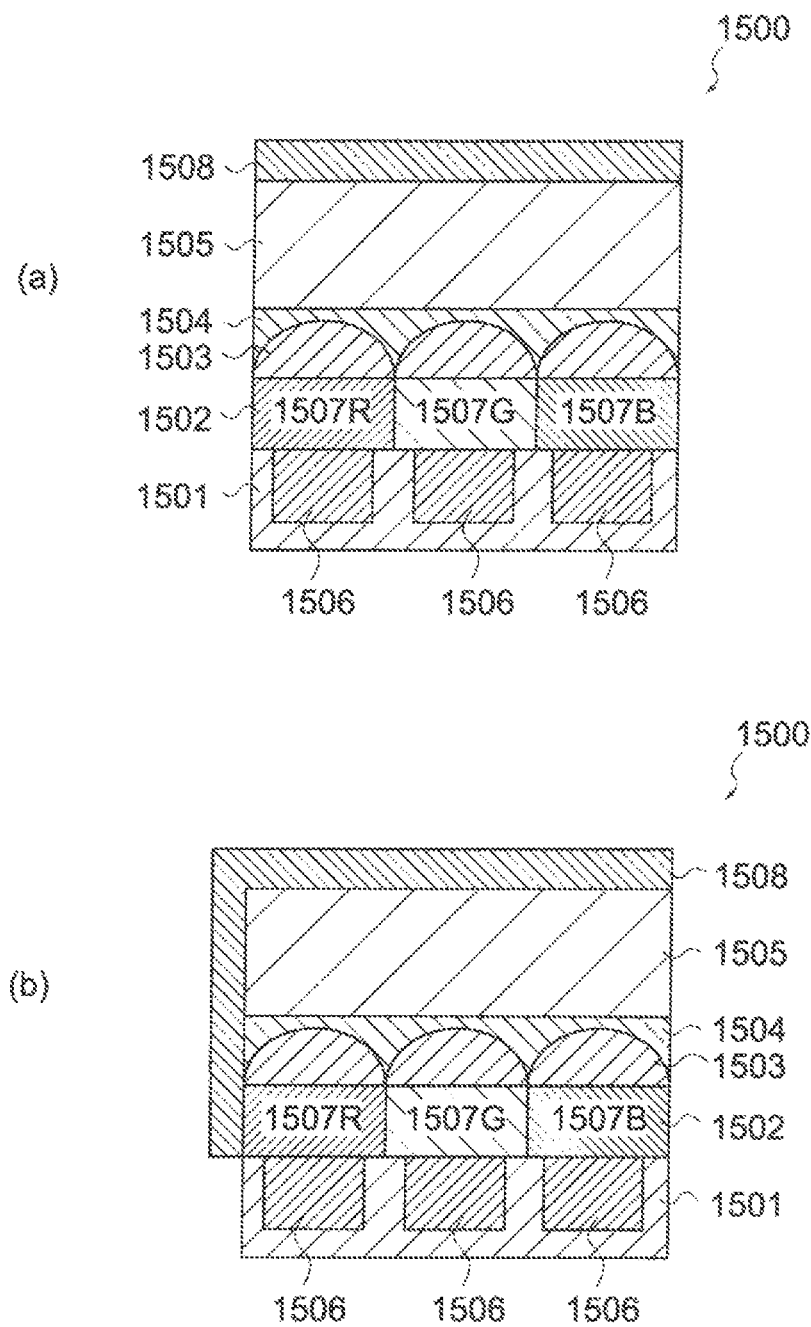
FIG. 8 Schematic diagrams of an image pickup device according to a third embodiment of the present technique.

FIG. 8 are schematic diagrams each showing the image pickup device 1500 of this embodiment. FIG. 8A shows a center portion of the image pickup device 1500, and FIG. 8B shows an end portion (outer circumferential portion) of the image pickup device 1500. As shown in the figures, the image pickup device 1500 is formed by laminating a photoelectric conversion layer 1501, a color filter layer 1502, on-chip lenses 1503, a low-refractive-index layer 1504, an infrared absorption layer 1505, and a protection layer 1508.

The photoelectric conversion layer 1501, the color filter layer 1502, the on-chip lenses 1503, the low-refractive-index layer 1504, and the infrared absorption layer 1505 have structures similar to those of the first embodiment. A plurality of photoelectric conversion devices 1506 are formed in the photoelectric conversion layer 1501. The color filter layer 1502 includes a red color filter 1507R, a green color filter 1507G, and a blue color filter 1507B (hereinafter, collectively referred to as color filters 1507) respectively corresponding to the photoelectric conversion devices 1506.

The protection layer 1508 is laminated on the infrared absorption layer 1505 and shields oxygen and moisture or suppresses physical damages. By the protection layer 1508 shielding oxygen, oxygen is prevented from teaching the infrared-absorption layer 1505, and oxidization of the infrared absorption pigment included in the infrared absorption layer 1505 is prevented.

The protection layer 1508 can be formed of a material capable of shielding oxygen, such as silver oxide (I) ($Ag_2O$), silver monoxide (AgO), aluminum oxide ($Al_2O_3$), aluminum fluoride (AlF$_3$), barium fluoride (BaF$_2$), cerium oxide (IV) (CeO$_2$), chromium oxide (III) (Cr$_2$O$_3$), chromium sulfide (III) (Cr$_2$S$_3$), gadolinium fluoride (GdF$_3$), hafnium oxide (IV) (HfO$_2$), indium tin oxide (ITO), lanthanum fluoride (LaF$_3$), lithium niobate (LiNbO$_3$), magnesium fluoride (MgF$_2$), magnesium oxide (MgO), sodium hexafluoro aluminate (Na$_3$AlF$_6$), niobium pentoxide (Nb$_2$O$_5$), nichrome (Ni—Cr), a nitride of nichrome (NiCrN$_x$), nitrogen oxide (O$_x$N$_y$), silicon nitride (SiN$_4$), silicon oxide (SiO), silicon dioxide (SiO$_2$), tantalum pentoxide (Ta$_2$O$_5$), titanium trioxide (Ti$_2$O$_3$), titanium pentoxide (Ti$_3$O$_5$), titanium oxide (TiO), titanium dioxide (TiO$_2$), tungsten oxide (WO$_3$), yttrium oxide (Y$_2$O$_3$), yttrium fluoride (YF$_3$), zinc sulfide (ZnS), zirconium dioxide (ZrO$_2$), and indium oxide (In$_2$O$_3$), though of course not limited thereto.

The protection layer 1508 may be formed to have a sufficient thickness to shield oxygen, for example, a thickness of about 300 nm. It is favorable for the protection layer 1508 to have high optical transparency. By forming the protection layer 1508 of a material that shields oxygen, and has a physically or chemically high intensity, the protection layer 1508 prevents physical or chemical damages of the lower layers in addition to the shielding of oxygen.

As shown in FIG. 8B, the protection layer 1508 can be formed on a side surface of the infrared absorption layer 1505 at the end portion (outer circumferential portion) of the image pickup device 1500. Accordingly, it becomes possible to also prevent, oxygen from reaching the side surfaces of the infrared absorption layer 1505.

Fourth Embodiment

An image pickup device according to a fourth embodiment of the present technique will be described. The image pickup device of this embodiment can be mounted on an image pickup apparatus (camera etc.) together with an image pickup optical system that images an object on the image pickup device.

[Structure of Image Pickup Device]

Figure 9:
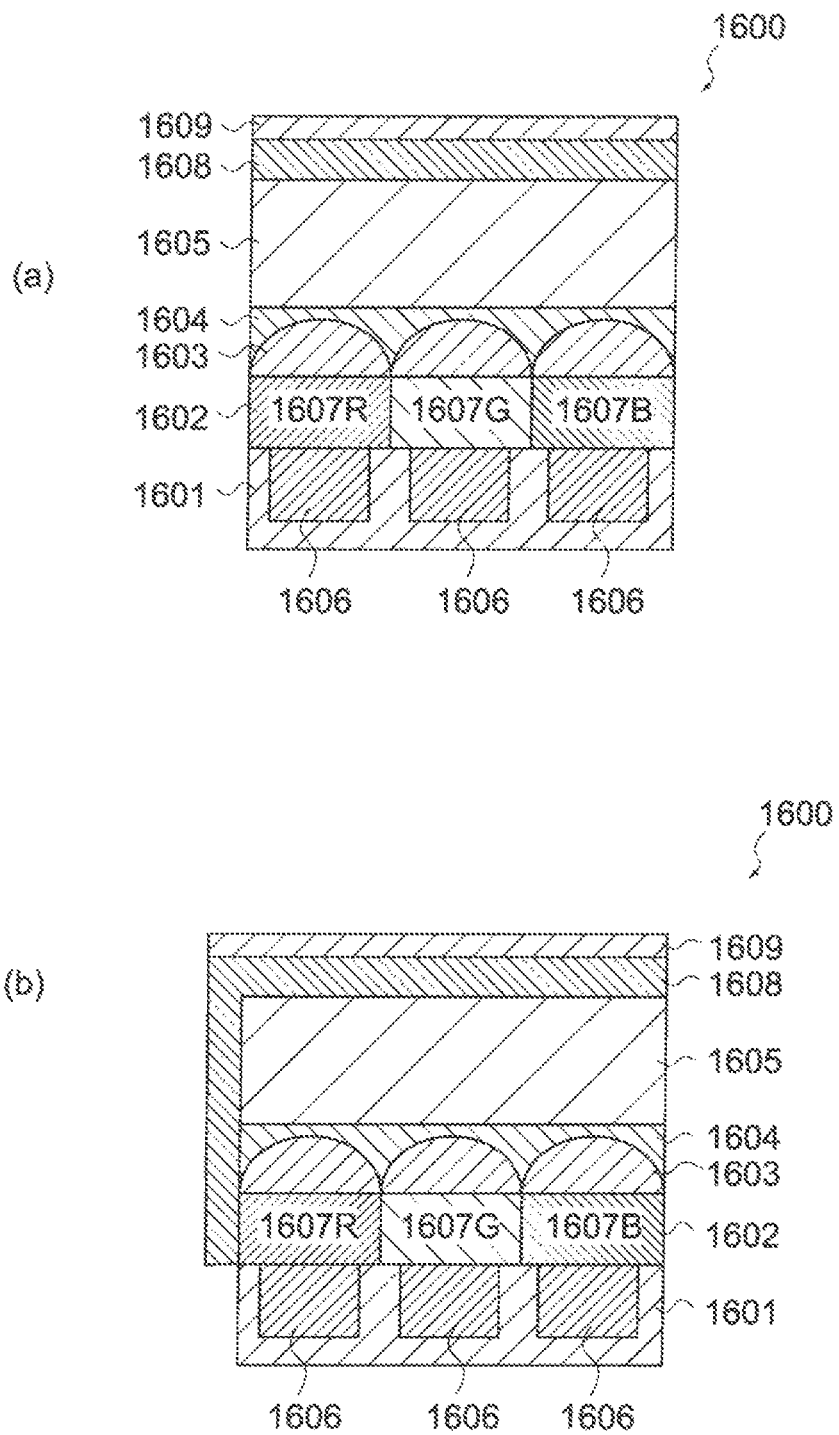
FIG. 9 Schematic diagrams of an image pickup device according to a fourth embodiment of the present technique.

FIG. 9 are schematic diagrams each showing the image pickup device 1600 of this embodiment FIG. 9A shows a center portion of the image pickup device 1600, and FIG. 9B shows an end portion (outer circumferential portion) of the image pickup device 1600. As shown in FIG. 9A, the image pickup device 1600 is formed by laminating a photoelectric conversion layer 1601, a color filter layer 1602, on-chip lenses 1603, a low-refractive-index layer 1604, an infrared absorption, layer 1605, a protection layer 1608, and an antireflection layer 1609.

The photoelectric conversion layer 1601, fee color filter layer 1602, the on-chip lenses 1603, the low-refractive-index layer 1604, and the infrared absorption layer 1605 have structures similar to those of the first embodiment. A plurality of photoelectric conversion devices 1606 are formed in the photoelectric conversion layer 1601. The color filter layer 1602 includes a red color filter 1607R, a green color filter 1607G, and a blue color filter 1607B (hereinafter, collectively referred to as color filters 1607) respectively corresponding to the photoelectric conversion devices 1606.

The protection layer 1608 is laminated on the infrared absorption layer 1605 and shields oxygen and moisture or suppresses physical damages. By the protection layer 1608 shielding oxygen, oxygen is prevented from reaching the infrared absorption layer 1605, and oxidization of the infrared absorption pigment included in the Infrared absorption layer 1605 is prevented.

The protection layer 1608 can be formed of a material capable of shielding oxygen, such as silver oxide (I) (Ag$_2$O), silver monoxide (AgO), aluminum oxide (Al$_2$O$_3$), aluminum fluoride (AlF$_3$), barium fluoride (BaF$_2$), cerium oxide (IV) (CeO$_2$), chromium oxide (III) (Cr$_2$O$_3$), chromium sulfide (III) (Cr$_2$S$_3$), gadolinium fluoride (GdF$_3$), hafnium oxide (IV) (HfO$_2$), indium tin oxide (ITO), lanthanum fluoride (LaF$_3$), lithium niobate (LiNbO$_3$), magnesium, fluoride (MgF$_2$), magnesium oxide (MgO), sodium hexafluoro aluminate (Na$_3$AlF$_6$), niobium pentoxide (Nb$_2$O$_5$), nichrome (Ni—Cr), a nitride of nichrome (NiCrN$_x$), nitrogen oxide (O$_x$N$_y$), silicon nitride (SiN$_4$), silicon oxide (SiO), silicon dioxide (SiO$_2$), tantalum pentoxide (Ta$_2$O$_5$), titanium trioxide (Ti$_2$O$_3$), titanium pentoxide (Ti$_3$O$_5$), titanium oxide (TiO), titanium dioxide (TiO$_2$), tungsten oxide (WO$_3$), yttrium oxide (Y$_2$O$_3$), yttrium fluoride (YF$_3$), zinc sulfide (ZnS), zirconium dioxide (ZrO$_2$), and indium oxide (In$_2$O$_3$), though of course not limited thereto.

The protection layer 1608 may be formed to have a sufficient thickness to shield oxygen, for example, a thickness of about 300 nm. It is favorable for the protection layer 1608 to have high optical transparency.

As shown in FIG. 9B, the protection layer 1608 can be formed on a side surface of the infrared absorption layer 1605 at the end portion (outer circumferential portion) of the image pickup device 1600. Accordingly, it becomes possible to also prevent oxygen from reaching the side surfaces of the infrared absorption layer 1605.

The antireflection layer 1609 is laminated on the protection layer 1608 as a top layer of the image pickup device 1600 and prevents reflection of incident light from the upper side and incident fight from the lower layer (infrared absorption layer 1605) side. The antireflection layer 1609 can be formed of an arbitrary material that lowers optical reflectance at an interface between air and the infrared absorption layer 1605. By forming the antireflection layer 1609 of a material having a physically or chemically high intensity, physical or chemical damages of the lower layers can also be prevented.

Fifth Embodiment

An image pickup device according to a fifth embodiment of the present technique will be described. The Image pickup device of this embodiment can be mounted on an image pickup apparatus (camera etc.) together with an image pickup optical system that images an object on the image pickup device.

[Structure of Image Pickup Device]

Figure 10:
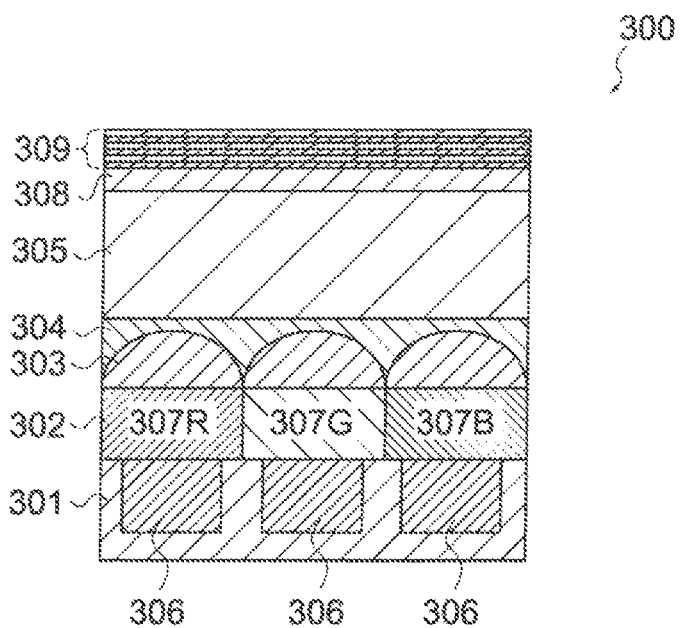
FIG. 10 A schematic diagram of an image pickup device according to a fifth embodiment of the present technique.

FIG. 10 is a schematic diagram showing the image pickup de vice 300 of this embodiment. As shown in the figure, the image pickup device 300 is formed by laminating a photoelectric conversion layer 301, a color filter layer 302, on-chip lenses 303, a low-reflective-index layer 304, an Infrared absorption layer 305, a protection layer 308, and a bandpass layer 309.

The photoelectric conversion layer 301, the color filter layer 302, the on-chip lenses 303, the low-refractive-index layer 304, and the infrared absorption layer 305 have structures similar to those of the first embodiment. A plurality of photoelectric conversion devices 306 are formed in the photoelectric conversion layer 301. The color filter layer 302 includes a red color filter 307R, a green color filter 307G, and a blue color filter 307B (hereinafter, collectively referred to as color filters 307) respectively corresponding to the photoelectric conversion, devices 306.

The protection layer 308 is laminated on the infrared absorption layer 305 and shields oxygen and moisture or suppresses physical damages. Accordingly, as shown in FIG. 10, it becomes possible to laminate the bandpass layer 309 on the infrared absorption layer 305 via the protection layer 308. It should be noted that depending on the lamination method of the bandpass layer 30% the protection layer 308 does not need to be provided.

The protection layer 308 can be formed of a material capable of shielding oxygen, such as silver oxide (I) ($Ag_2O$), silver monoxide (AgO), aluminium oxide ($Al_2O_3$), aluminium fluoride ($AlF_3$), barium fluoride ($BaF_2$), cerium oxide (IV) ($CeO_2$), chromium oxide (III) ($Cr_2O_3$), chromium sulfide (III) ($Cr_2S_3$), gadolinium fluoride ($GdF_3$), hafnium oxide (IV) ($HfO_2$), indium tin oxide (ITO), lanthanum fluoride ($LaF_3$), lithium niobate ($LiNbO_3$), magnesium fluoride ($MgF_2$), magnesium oxide (MgO), sodium hexafluoro aluminate ($Na_3AlF_6$), niobium pentoxide ($Nb_2O_5$), nichrome (Ni—Cr), a nitride of nichrome ($NiCrN_x$), nitrogen oxide ($O_xN_y$), silicon nitride ($SiN_4$), silicon oxide (SiO), silicon dioxide ($SiO_2$), tantalum pentoxide ($Ta_2O_5$), titanium trioxide ($Ti_2O_3$), titanium pentoxide ($Ti_3O_5$), titanium oxide (TiO), titanium dioxide ($TiO_2$), tungsten oxide ($WO_3$), yttrium oxide ($Y_2O_3$), yttrium fluoride ($YF_3$), zinc sulfide (ZnS), zirconium dioxide ($ZrO_2$), and indium oxide ($In_2O_3$), though of course not limited thereto.

The bandpass layer 309 is laminated on the protection layer 308 and removes a part or all of purple light included in the incident light and light having a shorter wavelength than the purple light, or infrared light, or both of them. The bandpass layer 309 can be formed by alternately laminating a layer formed of a high-refractive-index material and a layer formed of a low-refractive-index material, and a part or all of purple light and light having a shorter wavelength than the purple light, or infrared light, or both of them is reflected by the interferences of light at the interlayers so that visible light is transmitted.

The image pickup device 300 includes the infrared absorption layer 305 in addition to the bandpass layer 309. In this embodiment, by both the bandpass layer 309 and the infrared absorption layer 305, infrared components are prevented from reaching the photoelectric conversion devices 306. Further, by the bandpass layer 309, a part or ah of purple light and light having a shorter wavelength than the purple light can be removed.

Figure 11:
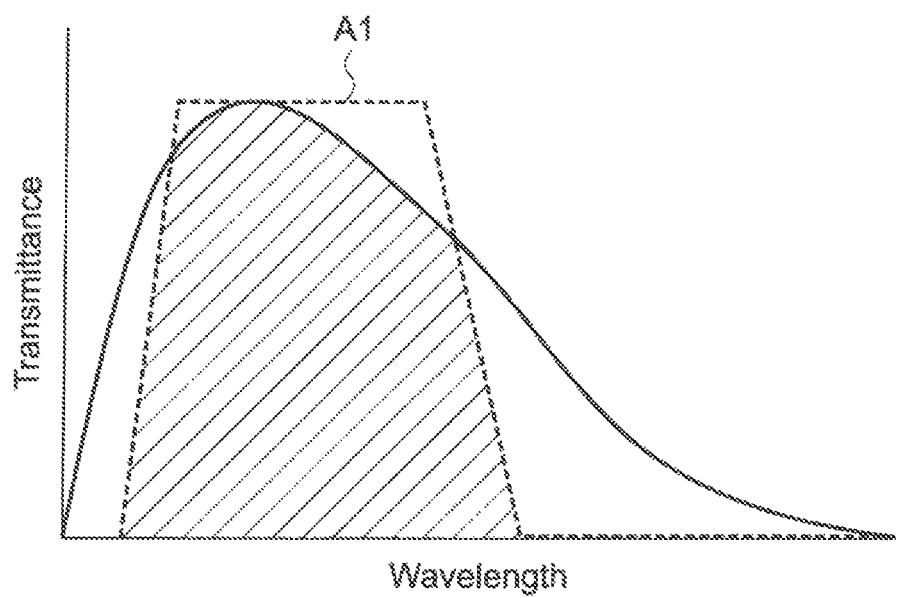
FIG. 11 A graph showing transmission spectroscopic characteristics obtained by an infrared absorption layer of the image pickup device.
Figure 12:
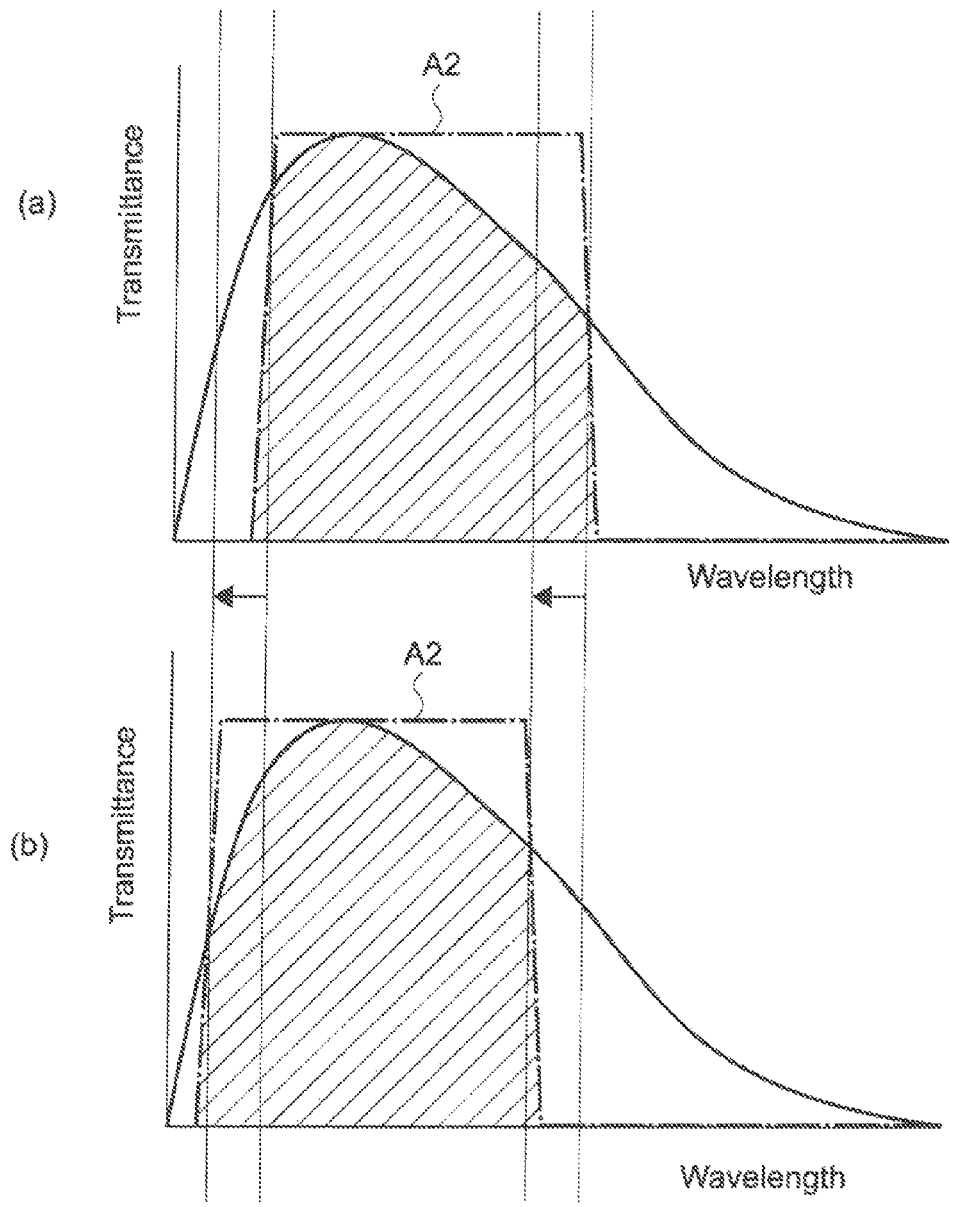
FIG. 12 Graphs showing transmission spectroscopic characteristics obtained by a bandpass layer of the image pickup device.
Figure 13:
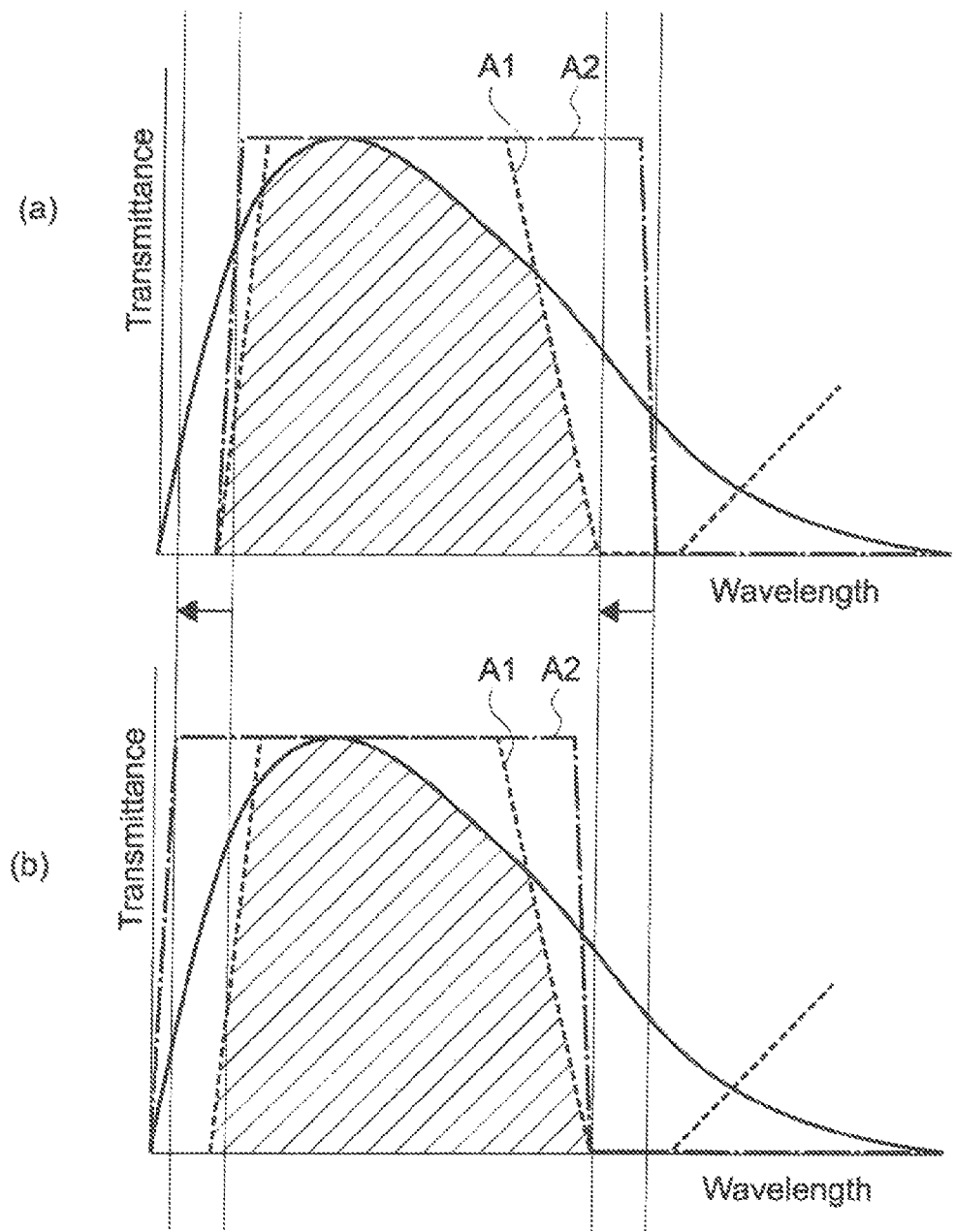
FIG. 13 Graphs showing transmission spectroscopic characteristics obtained by the infrared absorption layer and bandpass layer of the image pickup device.

FIGS. 11 to 13 are each a graph showing transmission spectroscopic characteristics obtained by the bandpass layer 309 and the infrared absorption layer 305. FIG. 11 is a graph showing a transmission wavelength band A1 of only the infrared absorption layer 305 and spectral sensitivity characteristics of the photoelectric conversion devices 306 and shows that light included in the transmission wavelength band of the infrared absorption layer 305 (hatched portion of figure) is not absorbed by the infrared absorption layer 305 and is detected by the photoelectric conversion devices 306.

FIG. 12 are each a graph showing a transmission wavelength band A2 of only the bandpass layer 309 and spectral sensitivity characteristics of the photoelectric conversion devices 306. FIG. 12A shows a case where a light incident angle with respect to the image pickup device 300 is 0° (direction vertical to layer), and FIG. 12B shows a case where the incident angle is 30° (30° from direction vertical, to layer). As shown in FIGS. 12A and 12B, the transmission wavelength band A2 of the bandpass layer 309 shifts to a short wavelength side by the light incident angle. This is because the bandpass layer 309 uses interferences of light by the multilayer film, and the optical channel length changes based on the incident angle.

Therefore, the following problems arise when attempting to remove infrared components by the bandpass layer 309 alone. In recent years, due to thinning of image pickup apparatuses, a focal distance of art image pickup leas is apt to become short, and an exit pupil distance also becomes small in the image pickup lens having a short focal distance. Therefore, an incident angle in the periphery of an angle of view becomes larger than that at a center of the angle of view (center of photoelectric conversion layer 301). Therefore, the transmission wavelength of the bandpass layer 309 varies depending on the position of the photoelectric conversion devices 306 in the photoelectric conversion layer 301, and thus deterioration of in-plane uniformity, in which color reproducibility varies depending on a position of a pickup image, occurs.

On the other hand, FIG. 13 shows the transmission wavelength band A1 (A1 sometimes has transmittance on long wavelength side) of the infrared absorption layer 305, the transmission wavelength band A2 of the bandpass layer 309, and the optical characteristics of the photoelectric conversion devices 306. FIG. 13A shows a case where the light incident angle with respect to the image pickup device 300 is 0° (direction vertical to layer), and FIG. 13B shows a case where the incident angle is 30° (30° from direction vertical to layer). As shown in FIGS. 13A and 13B, even when the transmission wavelength band A2 of the bandpass layer 309 is shifted based on a difference in the light incident angles with respect to the image pickup device 300, the transmission wavelength band can be maintained by the transmission wavelength band A3 of the infrared absorption layer 305.

As described above, the image pickup device 300 of this embodiment can prevent fluctuations of the transmission wavelength band based on the light incident angle by using both the bandpass layer 309 and the infrared absorption layer 305. Further, since a predetermined amount of infrared components can be removed by the bandpass layer 309, the infrared absorption layer 305 can be thinned.

Sixth Embodiment

An image pickup, device according to a sixth embodiment of the present technique will be described. The image pickup device of this embodiment can be mounted on an image pickup apparatus (camera etc.) together with an image pickup optical system that images an object on the image pickup device.

[Structure of Image Pickup Device]

Figure 14:
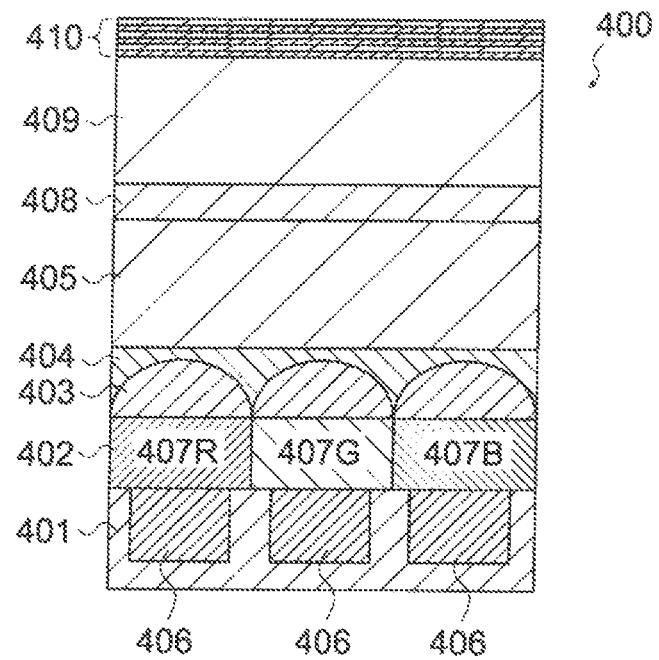
FIG. 14 A schematic diagram of an image pickup device according to a sixth embodiment of the present technique.

FIG. 14 is a schematic diagram showing the image pickup device 400 of this embodiment. As shown in the figure, the image pickup device 400 is formed by laminating a photoelectric conversion layer 401, a color filler layer 402, on-chip lenses 403, a low-refractive-index layer 404, an infrared absorption layer 405, an adhesive layer 408, a support substrate 409, and a bandpass layer 410.

The photoelectric conversion layer 401, the color filter layer 402, the on-chip lenses 403, the low-refractive-index layer 404, and the infrared absorption layer 405 have structures similar to those of the first embodiment. A plurality of photoelectric conversion devices 406 are formed in the photoelectric conversion layer 401. The color filter layer 402 includes a red color filter 407R, a green color filter 407G, and a blue color filter 407B (hereinafter, collectively referred to as color filters 407) respectively corresponding to the photoelectric conversion devices 406.

The adhesive layer 408 is laminated on the infrared absorption layer 405 and adheres the infrared absorption layer 405 and the support substrate 409. The adhesive layer 408 can be formed of an arbitrary material having adhesiveness, such as a synthetic resin, and a material having high optical transparency is favorable. Moreover, the adhesive layer 408 may additionally include an infrared absorption ability. In this case, the adhesive layer 408 may include the infrared absorption material described above (infrared absorption material described is descriptions on infrared absorption layer 105).

The support substrate 409 is laminated on the adhesive layer 408 and supports the bandpass layer 410. The support, substrate 409 may be a plate-like member having a certain amount of intensity and may be formed of a material having high optical transparency, such as glass.

The bandpass layer 410 is laminated on the support substrate 409 and removes a part or all of purple light and light having a shorter wavelength than the purple light, or infrared light, or both of them. The bandpass layer 410 has a structure in which the high-refractive-index material and the low-refractive-index material are laminated alternately as in the fifth embodiment.

With this structure, it is possible to separately create a laminated body m which the bandpass layer 410 is laminated on the support substrate 409 and a laminated body in which the photoelectric conversion layer 401 to the infrared absorption layer 405 are laminated and adhere those two by the adhesive layer 408. A general production apparatus for an image pickup device does not include a function of depositing a multilayer film, and thus it is difficult to produce an image pickup device including a multilayer film by the general production apparatus for an image pickup device.

Here, with the structure of the image pickup device 400 of this embodiment, the production of the bandpass layer 410 and the production of fee lower layer laminated body (photoelectric conversion layer 401 to infrared absorption layer 405) can be carried out in different processes. Accordingly, the image pickup device 400 can be produced using the existing production apparatus and multilayer film deposition apparatus without a new introduction or large remodeling of the production apparatus.

Seventh Embodiment

An image pickup device according to a seventh embodiment of the present technique will be described. The image pickup device of this embodiment can be mounted on an image pickup apparatus (camera etc.) together with an image pickup optical system that images an object on the image pickup device.

[Structure of Image Pickup Device]

Figure 15:
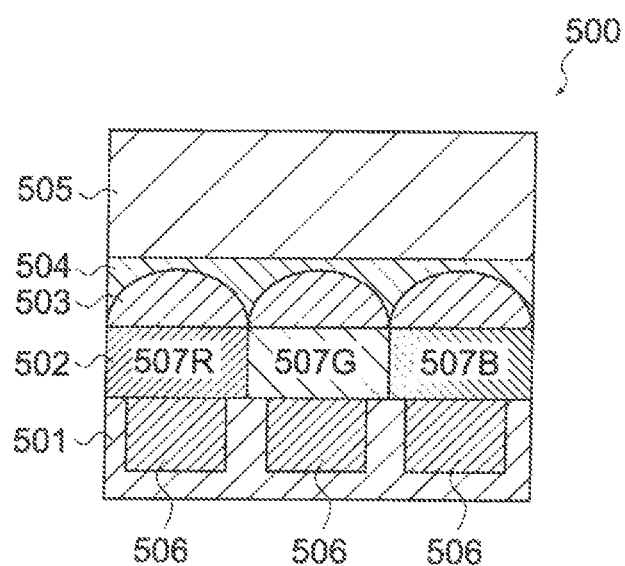
FIG. 15 A schematic diagram of an image pickup device according to a seventh embodiment of the present technique.

FIG. 15 is a schematic diagram showing the image pickup device 500 of this embodiment. As shown in the figure, the image pickup device 500 is formed by laminating a photoelectric conversion layer 501, a color filter/infrared absorption layer 502, on-chip lenses 503, a low-refractive-index layer 504, and an infrared absorption layer 505.

The photoelectric conversion, layer 501, the on-chip lenses 503, the low-refractive-index layer 504, and the infrared absorption layer 505 have structures similar to those of the first embodiment. A plurality of photoelectric conversion devices 506 are formed in the photoelectric conversion layer 501.

The color filter/infrared absorption layer 502 is laminated on the photoelectric conversion layer 501 and includes an infrared absorption ability it; addition to a color filter function. Specifically, the infrared absorption pigment as described in the first embodiment is mixed with color filters of the respective colors corresponding to the photoelectric conversion devices 506. As shown in FIG. 15, the color filter/infrared absorption layer 502 includes a red color filter/infrared absorption body 507R, a green color filter/infrared absorption body 507G, and a blue color filter/infrared absorption body 507B, and those will collectively be referred to as color filter/infrared absorption bodies 507. It should be noted that the transmission colors of the color filter/infrared absorption bodies 507 are not limited to the three colors above.

The image pickup device 500 is capable of removing infrared components from incident light also by the color filter/infrared absorption layer 502 in addition to the infrared absorption layer 505. Accordingly, the thickness of each of the layers can be thinned more than in the case where only one of those is provided.

When removing infrared components using only the color filter/infrared absorption layer 32 as in the image pickup device 30 (see FIG. 5) according to the comparative example described above, the thickness cannot help but become large, thus causing a problem that Incident light enters another photoelectric conversion device. In contrast, in the image pickup device 500 of this embodiment, the color filter/infrared absorption layer 502 does not need to be made thick, and thus the problem that incident light enters another photoelectric conversion device 506 does not occur. Is addition, the image pickup device 500 is capable of sufficiently removing infrared components from incident light by the two infrared absorption layers, that is, the infrared absorption layer 505 and the color filter/infrared absorption layer 502.

Eighth Embodiment

An image pickup device according to an eighth embodiment of the present technique will be described. The image pickup device of this embodiment can be mounted on an image pickup apparatus (camera etc.) together with an image pickup optical system that images an object on the image pickup device.

[Structure of Usage Pickup Device]

Figure 16:
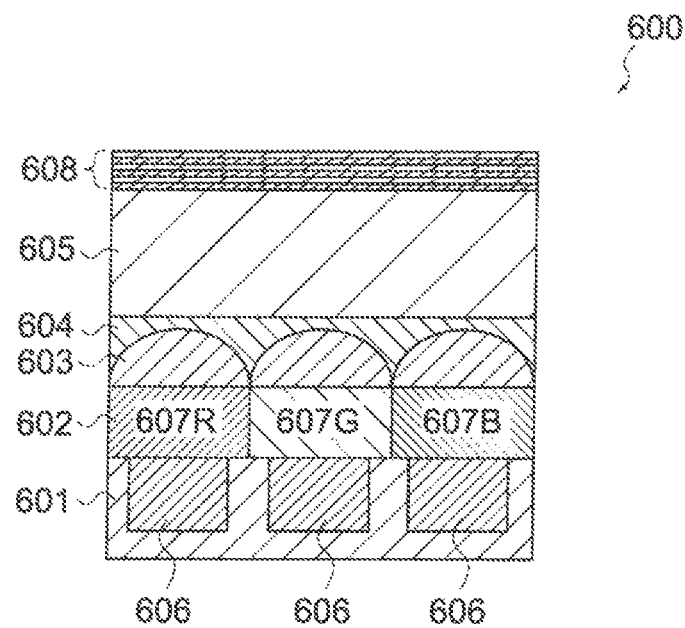
FIG. 16 A schematic diagram of an image pickup device according to an eighth embodiment of the present technique.

FIG. 16 is a schematic diagram, showing the image pickup device 600 of this embodiment. As shown in the figure, the image pickup device 600 is formed by laminating a photoelectric conversion layer 601, a color filler layer 602, on-chip lenses 603, a low-refractive-index layer 604, an infrared absorption layer 605, and a bandpass layer 608.

The photoelectric conversion layer 601, the color filter layer 602, the on-chip lenses 603, the low-refractive-index layer 604, and the infrared absorption layer 605 have structures similar to those of the first embodiment. A plurality of photoelectric conversion devices 606 are formed is the photoelectric conversion layer 601. The color filter layer 602 includes a red color filter 607R, a green color filter 607G, and a blue color filter 607B (hereinafter, collectively referred to as color filters 607) respectively corresponding to the photoelectric conversion devices 606.

The bandpass layer 608 has a structure similar to that of the fifth embodiment and is laminated on the infrared absorption layer 605. The image pickup device 600 of tins embodiment is capable of removing infrared components from incident light by both the infrared absorption layer 605 and the bandpass layer 608. The bandpass layer 608 is also capable of removing a part or all of purple light and light having a shorter wavelength than the purple light.

Ninth Embodiment

An image pickup device according to a ninth embodiment of die present technique will be described. The image pickup device of this embodiment can be mounted on an image pickup apparatus (camera etc.) together with an image pickup optical system that images an object on the image pickup device.

[Structure of Image Pickup Device]

Figure 17:
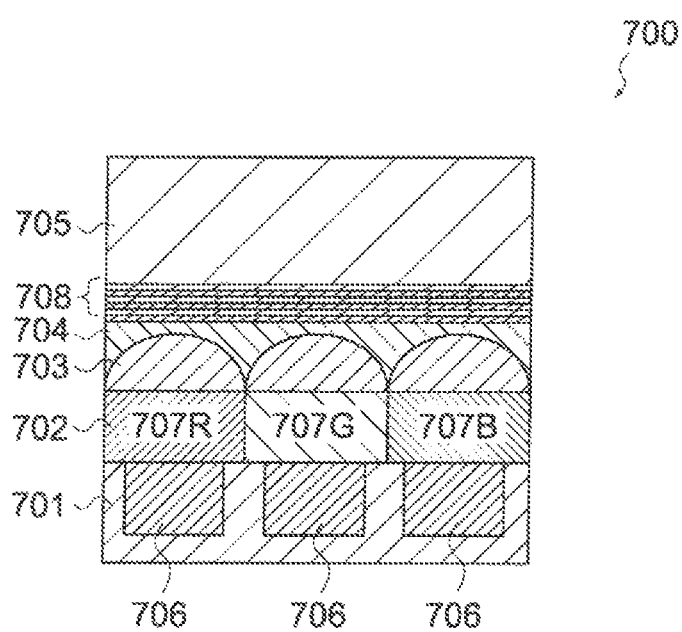
FIG. 17 A schematic diagram of an image pickup device according to a ninth embodiment of the present technique.

FIG. 17 is a schematic diagram showing the image pickup device 700 of this embodiment. As shown in the figure, the image pickup device 700 is formed by laminating a photoelectric conversion layer 701, a color filter layer 702, on-chip lenses 703, a low-refractive-index layer 704, a bandpass layer 708, and an infrared absorption layer 705.

The photoelectric conversion layer 701, the color filter layer 702, the on-chip lenses 703, the low-refractive-index layer 704, and the infrared absorption layer 705 have structures similar to those of the first embodiment. A plurality of photoelectric conversion devices 706 are formed in the photoelectric conversion layer 701. The color filter layer 702 includes a red color filter 707R, a green color filler 707G, and a blue color filter 7078 (hereinafter, collectively referred to as color filters 707) respectively corresponding to the photoelectric conversion devices 706.

The bandpass layer 708 has a structure similar to that of the fifth embodiment and is laminated on the low-refractive-index layer 704. Also with such a structure, infrared components of incident light can be removed by the infrared absorption layer 705 and the bandpass layer 708. The bandpass layer 708 is also capable of removing a part or all of purple light and light having a shorter wavelength than the purple light.

Tenth Embodiment

An image pickup device according to a tenth embodiment of the present technique will be described. The image pickup device of this embodiment can be mounted, on an image pickup apparatus (camera etc.) together with an image pickup optical system that images an object on the image pickup device.

[Structure of Image Pickup Device]

Figure 18:
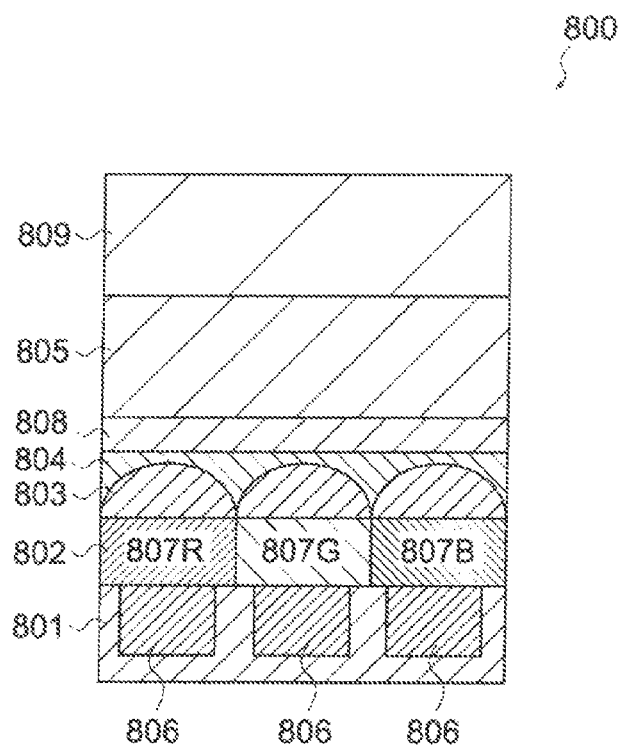
FIG. 18 A schematic diagram of an image pickup device according to a tenth embodiment of the present technique.

FIG. 18 is a schematic diagram showing the image pickup device 800 of this embodiment. As shown in the figure, the image pickup device 800 is formed by laminating a photoelectric conversion layer 801, a color filter layer 802, on-chip lenses 803, a low-refractive-index layer 804, an adhesive layer 808, an infrared absorption layer 805, and a support substrate 809.

The photoelectric conversion layer 801, fee color filter layer 802, the on-chip lenses 803, and fee low-refractive-index layer 804 have structures similar to those of the first embodiment. A plurality of photoelectric conversion devices 806 are formed in the photoelectric conversion layer 801. The color filter layer 802 includes a red color filter 807R, a green color filter 807G, and a blue color filter 807B (hereinafter, collectively referred to as color-filters 807) respectively corresponding to the photoelectric conversion devices 806.

The adhesive layer 808 is laminated on the low-refractive-index layer 804 and adheres the infrared absorption layer 805 to the low-refractive-index layer 804. The adhesive layer 808 can be formed of an arbitrary material having adhesiveness, such as a synthetic resin, and a material having high optical transparency is favorable. Moreover, the adhesive layer 808 may additionally include an infrared absorption ability. In this case, the adhesive layer 808 may include the infrared absorption material described above (infrared absorption material described in descriptions on infrared absorption layer 105).

The support substrate 809 supports the infrared absorption layer 805. The support substrate 809 may be a plate-like member having a certain amount of intensity and may be formed of a material having high optical transparency, such as glass.

The infrared absorption layer 805 has a structure similar to that of the first embodiment. Mere, in this embodiment, the infrared absorption layer 805 is laminated on the support-substrate 809 in a production process of the image pickup device 800 and adhered onto the lower layer structure (photoelectric conversion layer 801 to low-refractive-index layer 804) with the support substrate 809 by the adhesive layer 808. Accordingly, the lower layer structure and infrared absorption layer 805 of the image pickup device can be produced in different production processes (production apparatuses).

Eleventh Embodiment

An image pickup device according to an eleventh embodiment of the present technique will be described. The Image pickup device of this embodiment can be mounted on an image pickup apparatus (camera etc.) together with an image pickup optical system that images an object on the image pickup device.

[Structure of Image Pickup Device]

Figure 19:
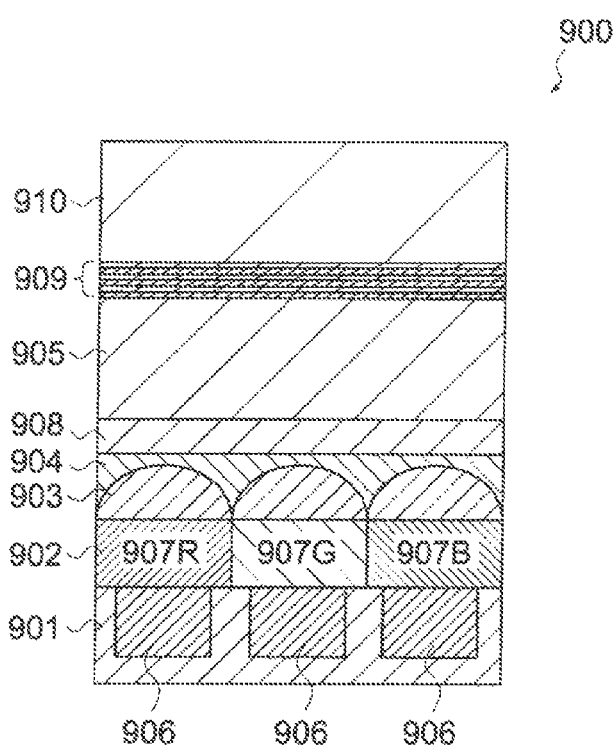
FIG. 19 A schematic diagram of an image pickup device according to an eleventh embodiment of the present technique.

FIG. 19 is a schematic diagram showing the image pickup device 900 of this embodiment. As shown in the figure, the image pickup device 900 is formed by laminating a photoelectric conversion layer 901, a color filter layer 902, on-chip lenses 903, a low-refractive-index layer 904, an adhesive layer 908, an infrared absorption layer 905, a bandpass layer 909, and a support substrate 910.

The photoelectric conversion layer 901, the color filter layer 902, the on-chip lenses 903, and the low-refractive-index layer 904 have structures similar to those of the first embodiment. A plurality of photoelectric conversion devices 906 are formed in the photoelectric conversion layer 901. The color filter layer 902 includes a red color filter 907R, a green color filter 907G, and a blue color filter 907B (hereinafter, collectively referred to as color filters 907) respectively corresponding to the photoelectric conversion devices 906.

The adhesive layer 908 is laminated on the low-refractive-index layer 904 and adheres the infrared absorption layer 905 to the low-refractive-index layer 904. The adhesive layer 908 can be formed of an arbitrary material having adhesiveness, such as a synthetic resin, and a material having high optical transparency is favorable. Moreover, the adhesive layer 908 may additionally include an infrared absorption ability. In this case, the adhesive layer 908 may include the infrared absorption material described above (infixed absorption material described in descriptions on infrared absorption layer 105).

The bandpass layer 909 has a structure similar to that of the fifth embodiment and is laminated on the infrared absorption layer 905. Also with such a structure, Infrared components of incident light can be removed by tire infrared absorption layer 905 and the bandpass layer 909. The bandpass layer 909 is also capable of removing a part or all of purple light and light having a shorter wavelength than the purple light.

The support substrate 910 supports the bandpass layer 909 and the infrared absorption layer 905. The support substrate 910 may be a plate-like member having a certain amount of intensity and may be formed of a material having high optical transparency, such as glass.

The bandpass layer 909 and the infrared absorption layer 905 can be laminated on the support substrate 910 in the production process of the image pickup device 900. Specifically, the bandpass layer 909 is laminated first on the support substrate 910, and the infrared absorption layer 905 is laminated on the bandpass layer 909.

In this embodiment, a laminated body in which the bandpass layer 909 and the infrared absorption layer 905 are laminated on the support substrate 910 is adhered onto the lower layer structure (photoelectric conversion layer 901 to low-refractive-index layer 904) by the adhesive layer 908. Accordingly, the lower layer structure of the image pickup device 900 and the bandpass layer 909 and infrared absorption layer 90S can be produced in different production processes (production apparatuses).

Twelfth Embodiment

An image pickup device according to a twelfth embodiment of the present technique will be described. The image pickup device of this embodiment can be mounted on an image pickup apparatus (camera etc.) together with an image pickup optical system that images an object on the image pickup device.

[Structure of Image Pickup Device]

Figure 20:
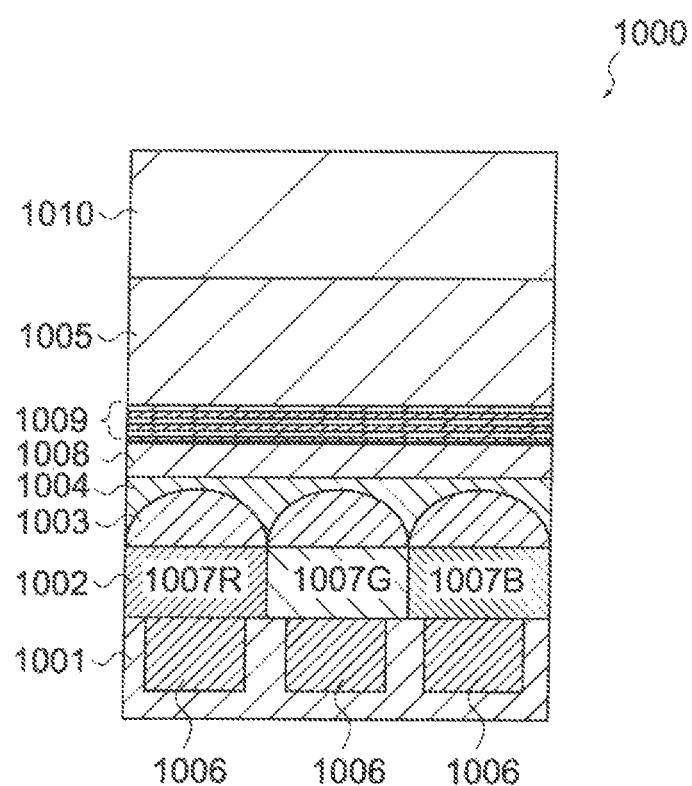
FIG. 20 A schematic diagram of an image pickup device according to a twelfth embodiment of the present technique.

FIG. 20 is a schematic diagram showing the image pickup device 1000 of this embodiment. As shown in the figure, the image pickup device 1000 is formed by laminating a photoelectric conversion layer 1001, a color filter layer 1002, on-chip lenses 1003, a low-refractive-index layer 1004, an adhesive layer 1008, a bandpass layer 1009, an infrared absorption layer 1005, and a support substrate 1010.

The photoelectric conversion layer 1001, the color filter layer 1002, the on-chip lenses 1003, and the low-refractive-index layer 1004 have structures similar to those of the first embodiment. A plurality of photoelectric devices 1006 are formed in the photoelectric conversion layer 1001. The color filter layer 1002 includes a red color filter 1007R, a green color filter 1007G, and a blue color filter 1007B (hereinafter, collectively referred to as color filters 1007) respectively corresponding to the photoelectric conversion devices 1006.

The adhesive layer 1008 is laminated on the low-refractive-index layer 1004 and adheres the bandpass layer 1009 to the low-refractive-index layer 1004. The adhesive layer 1008 can be formed of an arbitrary material having adhesiveness, such as a synthetic resin, and a material having high optical transparency is favorable. Moreover, the adhesive layer 1008 may additionally include an infrared absorption ability. In this case, the adhesive layer 1008 may include the infrared absorption material described above (infrared absorption material described in descriptions on infrared absorption layer 105).

The bandpass layer 1009 has a structure similar to that of the fifth embodiment and is laminated m the adhesive layer 1008. Also with such a structure, infrared components of incident light can be removed by the infrared absorption layer 1005 and the bandpass layer 1009. The bandpass layer 1009 is also capable of removing a part or all of purple light and light having a shorter wavelength than the purple light.

The support, substrate 1010 supports the infrared absorption layer 1005 and the bandpass layer 1009. The support substrate 1010 may be a plate-like member having a certain amount of intensity and may be formed of a material having high optical transparency, such as glass.

The infrared absorption layer 1005 and the bandpass layer 1009 can be laminated on the support substrate 1010 in the production process of the image pickup device 1000. Specifically, the infrared absorption layer 1005 is laminated first on the support substrate 1010, and the bandpass layer 1009 is laminated on the infrared absorption layer 1005.

In this embodiment, a laminated body in which the infrared absorption layer 1005 and the bandpass layer 1009 are laminated on the support substrate 1010 is adhered onto the lower layer structure (photoelectric conversion layer 1001 to low-refractive-index layer 1004) by the adhesive layer 1008. Accordingly, the lower layer structure of the image pickup device and the infrared absorption layer 1005 and bandpass layer 1009 can be produced in different production processes (production apparatuses).

Thirteenth Embodiment

An image pickup device according to a twelfth embodiment of the present technique will be described. The image pickup device of this embodiment can be mounted on an image pickup apparatus (camera etc.) together with an image pickup optical system that images an object on the image pickup device.

[Structure of Image Pickup Device]

Figure 21:
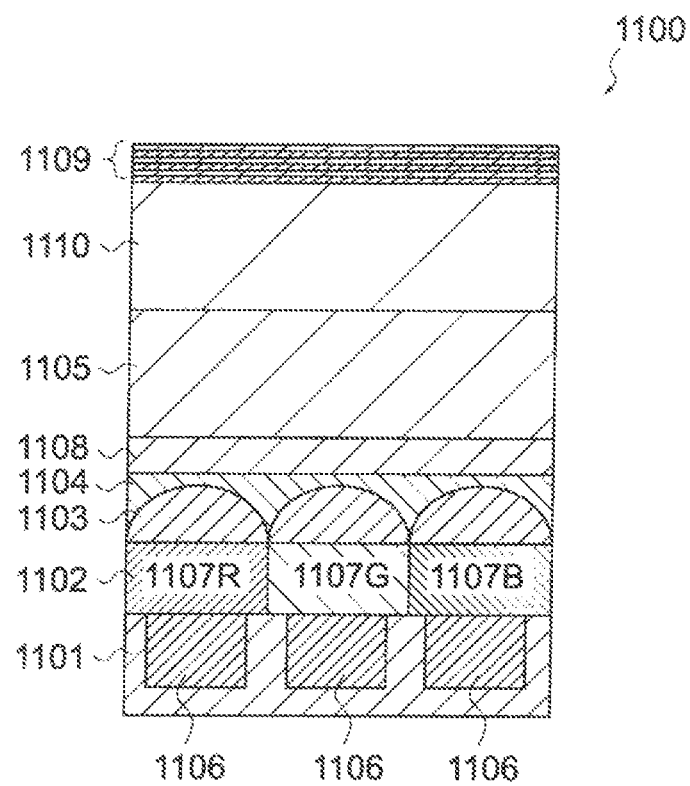
FIG. 21 A schematic diagram of an image pickup device according to a thirteenth embodiment of the present technique.

FIG. 21 is s schematic diagram showing the image pickup device 1100 of this embodiment. As shown in the figure, the image pickup device 1100 is formed by laminating a photoelectric conversion layer 1101, a color filter layer 1102, on-chip lenses 1103, a low-refractive-index layer 1104, an adhesive layer 1108, an infrared absorption layer 1105, a support substrate 1110, and a bandpass layer 1109.

The photoelectric conversion layer 1101, the color filter layer 1102, the on-chip lenses 1103, and the low-refractive-index layer 1104 have structures similar to those of the first embodiment. A plurality of photoelectric conversion devices 1106 are formed in the photoelectric conversion layer 1101. The color filter layer 1102 includes a red color filter 1107R, a green color filter 1107G, and a blue color filter 1107B (hereinafter, collectively referred to as color filters 1107) respectively corresponding to the photoelectric conversion devices 1106.

The adhesive layer 1108 is laminated on the low-refractive-index layer 1104 and adheres the infrared absorption layer 1105 to the low-refractive-index layer 1104. The adhesive layer 1108 can be formed of an arbitrary material having adhesiveness, such as a synthetic resin, and a material having high optical transparency is favorable. Moreover, the adhesive layer 1108 may additionally include an infrared absorption ability. In this case, the adhesive layer 1108 may include the infrared absorption material described above (infrared absorption material described is descriptions on infrared absorption layer 105).

The bandpass layer 1109 has a structure similar to that of the fifth embodiment and is laminated on the support substrate 1110. Also with such a structure, infrared components of incident light can be removed by the infrared absorption layer 1105 and the bandpass layer 1109. The bandpass layer 1109 is also capable of removing a part or all of purple light and light having a shorter wavelength than the purple light.

The support substrate 1110 supports the infrared absorption layer 1105 and the bandpass layer 1109. The support substrate 1110 may be a plate-like member having a certain amount of intensity and may be formed of a material having high optical transparency, such as glass.

The infrared absorption layer 1105 and the bandpass layer 1109 can be laminated on the support substrate 1110 in the production process of the image pickup device 1100. Specifically, the infrared absorption layer 1105 is laminated first on one surface of the support, substrate 1110, and the bandpass layer 1109 is laminated on the other surface of the support substrate 1110.

In this embodiment a laminated body in which the infrared absorption layer 1105 and the bandpass layer 1109 are laminated on the support substrate 1110 is adhered onto the lower layer structure (photoelectric conversion layer 1101 to low-refractive-index layer 1104) by the adhesive layer 1108. Accordingly, the lower layer structure of the image pickup device 1100 and the infrared absorption layer 1105 and bandpass layer 1109 can be produced in different production processes (production apparatuses).

Fourteenth Embodiment

An image pickup device according to a fourteenth embodiment of the present technique will be described. The image pickup device of this embodiment can be mounted on an image pickup apparatus (camera etc.) together with an image pickup optical system that images an object on the image-pickup device.

[Structure of Image Pickup Device]

Figure 22:
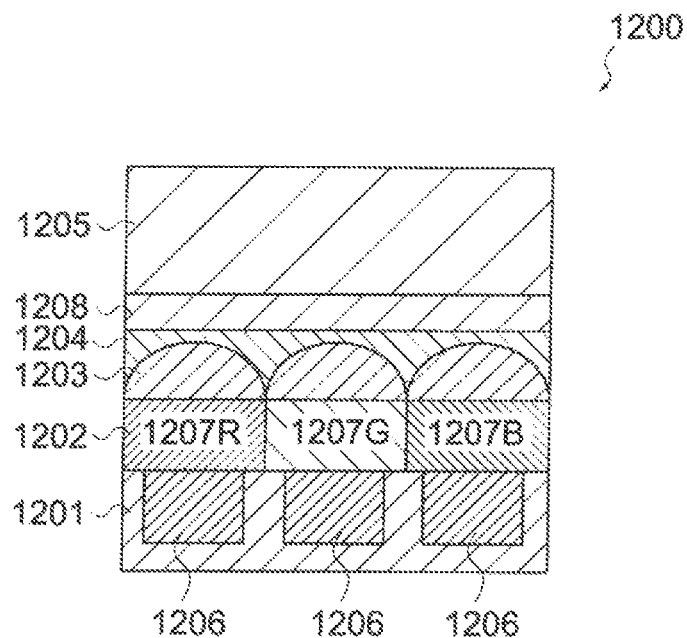
FIG. 22 A schematic diagram of an image pickup de vice according to a fourteenth embodiment of the present technique.

FIG. 22 is a schematic diagram showing the image pickup device 1200 of this embodiment. As shown in the figure, the image pickup device 1200 is formed by laminating a photoelectric conversion layer 1201, a color filter layer 1202, on-chip lenses 1203, a low-refractive-index layer 1204, an adhesive layer 1208, and an infrared absorption layer 1205.

The photoelectric conversion layer 1201, the color filter layer 1202, the on-chip lenses 1203, and the low-refractive-index layer 1204 have structures similar to those of the first embodiment. A plurality of photoelectric conversion devices 1206 are formed in the photoelectric conversion layer 1201. The color filter layer 1202 includes a red color filter 1207R, a green color filter 1207G, and a blue color filter 1207B (hereinafter, collectively referred to as color filters 1207) respectively corresponding to the photoelectric conversion devices 1206.

The adhesive layer 1208 is laminated on the low-refractive-index layer 1204 and adheres the infrared absorption layer 1205 to the low-refractive-index layer 1204. The adhesive layer 1208 can be formed of an arbitrary material having adhesiveness, such as a synthetic resin, and a material having high optical transparency is favorable. Moreover, the adhesive layer 1208 may additionally include an infrared absorption ability. In this case, the adhesive layer 1208 may include the infrared absorption material, described above (infrared absorption material described in descriptions on infrared absorption layer 105).

The infrared absorption layer 1205 can be laminated on a support substrate (not shown) in the production process of the image pickup device 1200. A laminated body in which the infrared absorption layer 1205 is laminated on the support, substrate is adhered onto the lower layer structure (photoelectric conversion layer 1201 to low-refractive-index layer 1204) by the adhesive layer 1208. The image pickup device 1200 can be produced by removing the support substrate after the adhesion.

In this embodiment, by removing the support substrate supporting the infrared absorption layer 1205, the lower layer structure of the image pickup device 1200 and the infrared absorption layer 1205 can be produced in different production processes (production apparatuses) while having a structure that does not include the support substrate.

Fifteenth Embodiment

An image pickup device according to a fifteenth embodiment of the present technique will be described. The image pickup device of this embodiment can be mounted on an image pickup apparatus (camera etc.) together with an image pickup optical system that images an object on the image pickup device.

[Structure of Image Pickup Device]

Figure 23:
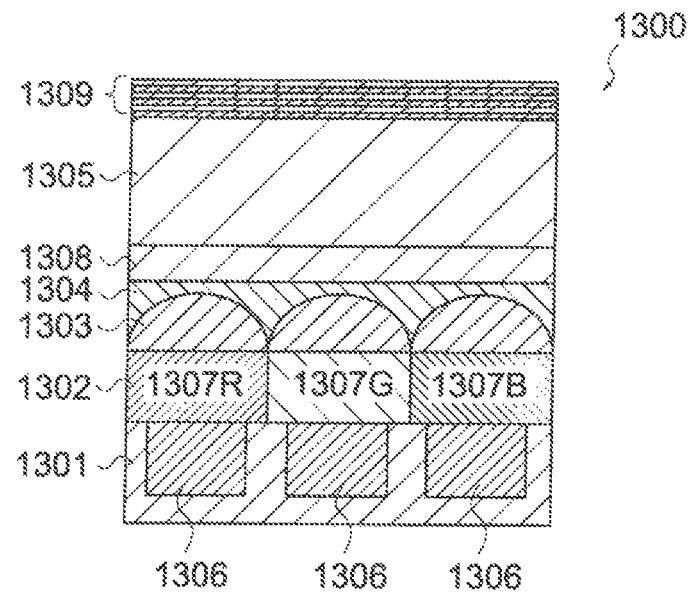
FIG. 23 A schematic diagram of an image pickup device according to a fifteenth embodiment of the present technique.

FIG. 23 is a schematic diagram showing the image pickup device 1300 of this embodiment. As shown in the figure, the image pickup device 1300 is formed by laminating a photoelectric conversion layer 1301, a color filter layer 1302, on-chip lenses 1303, a low-refractive-index layer 1304, an adhesive layer 1308, an infrared absorption layer 1305, and a bandpass layer 1309.

The photoelectric conversion layer 1301, the color filter layer 1302, the on-chip lenses 1303, and the low-refractive-index layer 1304 have structures similar to those of the first embodiment A plurality of photoelectric conversion devices 1306 are formed in the photoelectric conversion layer 1301. The color filter layer 1302 includes a red color filter 1307R, a green color filter 1307G, and a blue color filter 1307B (hereinafter, collectively referred to as color filters 1307) respectively corresponding to the photoelectric conversion devices 1306.

The adhesive layer 1308 is laminated on the low-refractive-index layer 1304 and adheres the infrared absorption layer 1305 to the low-refractive-index layer 1304. The adhesive layer 1308 can be formed of an arbitrary material having adhesiveness, such as a synthetic-resin, and a material having high optical transparency is favorable. Moreover, the adhesive layer 1308 may additionally include an infrared absorption, ability. In this case, the adhesive layer 1308 may include the infrared absorption material described above (infrared absorption material described in descriptions on infrared absorption layer 105).

The bandpass layer 1309 has a structure similar to that of the fifth embodiment and is laminated on the infrared absorption layer 1305. Also with such a structure, infrared components of incident light can be removed by the infrared absorption layer 1305 and the bandpass layer 1309. The bandpass layer 1309 is also capable of removing a part or all of purple light and fight having a shorter wavelength than the purple light.

The infrared absorption layer 1305 and the bandpass layer 1309 can be laminated on a support substrate (not shown) in the production process of the image pickup device 1300. Specifically, the bandpass layer 1309 is laminated first on the support substrate, and the infrared absorption layer 1305 is laminated on the bandpass layer 1309.

A laminated body in which the bandpass layer 1309 and the infrared absorption layer 1305 are laminated on the support substrate is adhered onto the lower layer structure (photoelectric conversion layer 1301 to low-refractive-index layer 1304) by the adhesive layer 1308. The image pickup device 1300 can be produced by removing the support substrate after the adhesion.

In this embodiment, by removing the support substrate supporting the bandpass layer 1309 and the infrared absorption layer 1305, the lower layer structure of the Image pickup device 1300 and the bandpass layer 1309 and infrared absorption layer 1305 can be produced in different production processes (production apparatuses) while having a structure that does not include the support substrate.

Sixteenth Embodiment

An image pickup device according to a sixteenth embodiment of the present technique will be described. The image pickup device of this embodiment can be mounted on an image pickup apparatus (camera etc.) together with an image pickup optical system that images an object on the image pickup device.

[Structure of Image Pickup Device]

Figure 24:
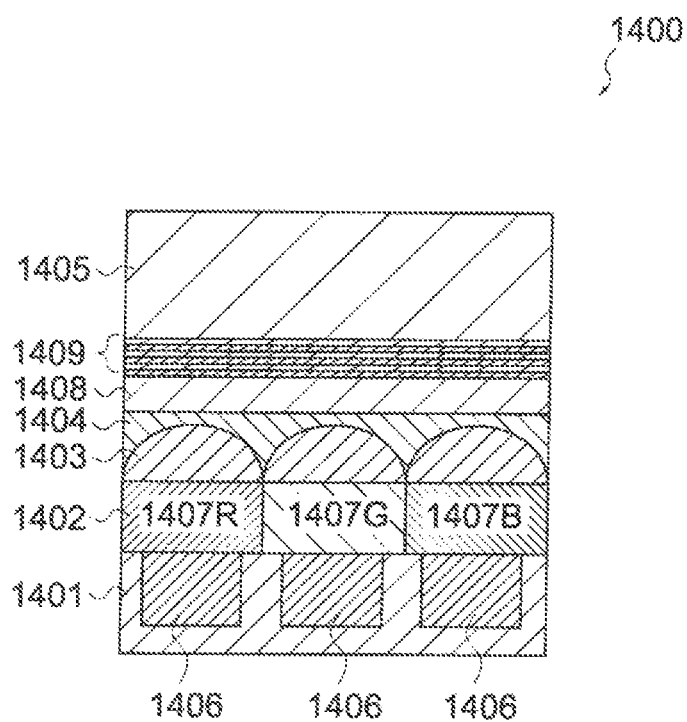
FIG. 24 A schematic diagram of an image pickup device according to a sixteenth embodiment of the present technique.

FIG. 24 is a schematic diagram showing the image pickup device 1400 of this embodiment. As shown in the figure, the image pickup device 1400 is formed by laminating a photoelectric conversion layer 1401, a color filter layer 1402, on-chip lenses 1403, a low-refractive-index layer 1404, an adhesive layer 1408, a bandpass layer 1409, and an infrared absorption layer 1405.

The photoelectric conversion layer 1401, the color filter layer 1402, the on-chip lenses 1403, and the low-refractive-index layer 1404 have structures similar to those of the first embodiment. A plurality of photoelectric conversion devices 1406 are formed in the photoelectric conversion layer 1401. The color filter layer 1402 includes a red color filter 1407R, a green color filter 1407G, and a blue color filter 1407B (hereinafter, collectively referred to as color filters 1407) respectively corresponding to the photoelectric conversion devices 1406.

The adhesive layer 1408 is laminated on the low-refractive-index layer 1404 and adheres the bandpass layer 1409 to the low-refractive-index layer 1404. The adhesive layer 1408 can be formed of an arbitrary material having adhesiveness, such as a synthetic resin, and a material having high optical transparency is favorable. Moreover, the adhesive layer 1408 may additionally include an infrared absorption ability. In this case, the adhesive layer 1408 may include the infrared absorption material described above (infrared absorption material described in descriptions on infrared absorption layer 105).

The bandpass layer 1409 has a structure similar to that of the fifth embodiment and is laminated on the adhesive layer 1408. Also with such a structure, infrared components of incident light can be removed by the infrared absorption layer 1405 and the bandpass layer 1409. The bandpass layer 1409 is also capable of removing a part or all of purple light and light having a shorter wavelength than fee purple light.

The bandpass layer 1409 and the infrared absorption layer 1403 can be laminated on a support substrate (not shown) in the production process of the image pickup device 1400. Specifically, the infrared absorption layer 1405 is laminated first on the support substrate, and the bandpass layer 1409 is laminated on the infrared absorption, layer 1405.

A laminated body in which the infrared absorption layer 1405 and the bandpass layer 1409 are laminated on the support substrate is adhered onto the lower layer structure (photoelectric conversion layer 1401 to low-refractive-index layer 1404) by the adhesive layer 1408. The image pickup device 1400 can be produced by removing the support substrate after the adhesion.

In this embodiment, by removing the support substrate supporting the infrared absorption layer 1405 and the bandpass layer 1409, the lower layer structure of the image pickup device 1400 and the infrared absorption layer 1405 and bandpass layer 1409 can be produced in different production processes (production apparatuses) while having a structure that does not include the support substrate.

The present technique is not limited to the embodiments above and can be changed without departing from the gist of the present technique.

For example, the image pickup devices of the above embodiments may each be a device in which the antireflection layer described in the second embodiment is laminated as a top layer. Further, when a bandpass layer is laminated on an infrared absorption layer, the protection layer described in the third embodiment may be interposed between the infrared absorption layer and the bandpass layer. Furthermore, as described in the first embodiment, a color filter layer does not necessarily need to be provided in the image pickup devices of the above embodiments.

It should be noted that the present technique may also take the following structures.

(1) An image pickup device, including:
an on-chip lens formed of a high-refractive-index material;
a low-refractive-index layer that is formed flat on the on-chip lens and formed of a low-refractive-index material; and
an infrared absorption layer that is formed of an infrared absorption material and laminated as a higher layer than the low-refractive-index layer, the infrared absorption material including an infrared absorption pigment and a binder resin, the binder resin being a synthetic resin constituted of a siloxane skeleton alone or a synthetic resin constituted of a siloxane skeleton part and a partial skeleton having a low reaction activity in an oxygen part.

(2) The image pickup device according to (1) above,
in which the infrared absorption material has a heat yellowing temperature of 180° C. or more.

(3) The image pickup device according to (1) or (2) above,
in which the infrared absorption pigment has a maximum absorption wavelength of 600 nm or more and 1200 nm or less and a molar absorption coefficient of 1000 L/mol·cm or more.

(4) The image pickup device according to any one of (1) to (3) above.
in which the infrared absorption pigment includes an anion pan that a larger size or formula weight or is more difficult to be oxidized than perchlorate and a cation part that has a larger size or formula weight or is more difficult to be oxidized than ammonium ions.

(5) The image pickup device according to any one of (1) to (4) above, further including
a protection layer that is laminated on the infrared absorption layer and shields oxygen and moisture or suppresses a physical damage.

(6) The image pickup device according to any one of (1) to (5) above, further including
a bandpass layer that is laminated as a higher layer than the low-refractive-index layer and is constituted of a multilayer film formed of a high-refractive-index material and a low-refractive-index material.

(7) The image pickup device according to any one of (1) to (6) above, further including
as antireflection layer that is laminated as a top layer and prevents reflection of light entering from an upper layer side and a lower layer side.

(8) The image pickup device according to any one of (1) to (7) above, further including
a color filter layer that is laminated as a lower layer than the on-chip lens.

(9) The image pickup device according to any one of (1) to (8) above, further including
a support substrate that supports the infrared absorption layer.
(10) The image pickup device according to any one of (1) to (9) above, further including
an adhesive layer feat is formed of an adhesive material and is laminated on the low-refractive-index layer.
(11) An image pickup device, including:
an on-chip lens formed of a high-refractive-index material;
a low-refractive-index layer that is formed flat on the on-chip lens and formed of a low-refractive-index material; and
an infrared absorption layer that is formed of an infrared absorption material and laminated as a higher layer than the low-refractive-index layer, the infrared absorption material including an infrared absorption pigment in a form of fine particles having a minor axis of 1 nm or more and a major axis of 50 nm or less.
(12) The image pickup device according to (11) above, in which the infrared absorption material includes at least one of a binder resin and an additive.
(13) The image pickup device according to (11) or (12) above,
In which the infrared absorption pigment has a maximum absorption wavelength of 600 nm or more and 1200 nm or less and a molar absorption coefficient of 1.000 L/mol·cm or more.
(14) The image pickup device according to any one of (11) to (13) above,
in which the infrared absorption pigment includes an anion part that has a larger size or formula weight or is more difficult to be oxidized than perchlorate Ions and a cation, part that has a larger size or formula weight or is more difficult to be oxidized than ammonium ions.
(15) The image pickup device according to any one of (11) to (14) above, further including
a protection layer that is laminated on the infrared absorption layer and shields oxygen and moisture or suppresses a physical damage.
(16) The image pickup device according to any one of (11) to (15) above, further including
a bandpass layer that is laminated as a higher layer than the low-refractive-index layer and is constituted of a multilayer film formed of a high-refractive-index material and a low-refractive-index material.
(17) The image pickup device according to any one of (11) to (16) above, further including
an antireflection layer that is laminated as a top layer and prevents reflection of light entering from an upper layer side and a lower layer side.
(18) The image pickup device according to any one of (11) to (17) above, further including
a color filter layer that is laminated as a lower layer than the on-chip lens.
(19) The image pickup device according to any one of (11) to (18) above, further including
a support substrate that supports the infrared absorption layer.
(20) The image pickup device according to any one of (11) to (19) above, further including
an adhesive layer that is formed of an adhesive material and is laminated on the low-refractive-index layer.

DESCRIPTION OF REFERENCE NUMERALS 100, 200, 300, 400, 500, 600, 700, 800, 900, 1000, 1100, 1200, 1300, 1400, 1500, 1600 image pickup device
101, 201, 301, 401, 501, 601, 701, 801, 901, 1001, 1101, 1201, 1301, 1401, 1501, 1601 photoelectric conversion layer
102, 202, 302, 402, 502, 602, 702, 802, 902, 1002, 1102, 1202, 1302, 1402, 1502, 1602 color filter layer
103, 203, 303, 403, 503, 603, 203, 803, 903, 1003, 1103, 1203, 1303, 1403, 1503, 1603 on-chip lens
104, 204, 304, 404, 504, 604, 704, 804, 904, 1004, 1104, 1204, 1304, 1404, 1504, 1604 low-refractive-index layer
105, 205, 305, 405, 505, 605, 705, 805, 905, 1005, 1105, 1205, 1305, 1405, 1505, 1605 infrared absorption layer
106, 206, 306, 406, 506, 606, 706, 806, 906, 1006, 1106, 1206, 1306, 1406, 1506, 1606 photoelectric conversion device
107, 207, 307, 407, 507, 607, 707, 807, 907, 1007, 1107, 1207, 1307, 1407, 1507, 1607 color filter
208, 1609 antireflection layer
308, 1508, 1608 protection layer
408, 808, 908, 1008, 1108, 1208, 1308, 1408 adhesive layer
309, 410, 608, 708, 909, 1009, 1109, 1309, 1409 bandpass layer
409, 809, 910, 1010 support substrate

The invention claimed is:
1. An image pickup device, comprising:
an on-chip lens that has a first refractive-index value;
a low-refractive-index layer on the on-chip lens, wherein the low-refractive-index layer has a second refractive-index value lower than the first refractive-index value;
a first infrared absorption layer on the low-refractive-index layer,
wherein the first infrared absorption layer comprises an infrared absorption material including a first infrared absorption pigment and a binder resin,
wherein the binder resin is one of:
a first synthetic resin that has a siloxane skeleton, or
a second synthetic resin that comprises a siloxane skeleton part and a partial-skeleton, and
wherein the binder resin has a low reaction activity in an oxygen part;
a bandpass layer on the first infrared absorption layer, wherein the bandpass layer comprises at least a first film that has the first refractive-index value and a second film that has the second refractive-index value; and
a second absorption layer below the on-chip lens, wherein the second absorption layer comprises a blend of a second infrared absorption pigment and at least one color filter.
2. The image pickup device according to claim 1, wherein a heat yellowing temperature of the infrared absorption material is greater than or equal to 180° C.
3. The image pickup device according to claim 1, wherein the first infrared absorption pigment has a maximum absorption wavelength greater than or equal to 600 nm and less than or equal to 1200 nm and a molar absorption coefficient greater than or equal to 1000 L/mol cm.
4. The image pickup device according to claim 1, wherein the first infrared absorption pigment includes:
an anion part that has a first size, a first formula weight, and a first oxidation affinity, wherein at least one of:
the first size is larger than a second size of a perchlorate ion,
the first formula weight is greater than a second formula weight of the perchlorate ion, or
the first oxidation affinity is less than a second oxidation affinity of the perchlorate ion; and a cation part that has a third size, a third formula weight, and a third oxidation affinity, wherein at least one of:
- the third size is larger than a fourth size of an ammonium ion,
- the third formula weight is greater than a fourth formula weight of the ammonium ion, or
- the third oxidation affinity is less than a fourth oxidation affinity of the ammonium ion.

5. The image pickup device according to claim 1, further comprising a protection layer on the first infrared absorption layer, wherein the protection layer is configured to at least shield oxygen and moisture or suppress a physical damage to the first infrared absorption layer.

6. The image pickup device according to claim 1, further comprising:
an antireflection layer on the first infrared absorption layer,
wherein the antireflection layer is configured to prevent reflection of light inside the image pickup device.

7. The image pickup device according to claim 1, further comprising a support substrate configured to support the first infrared absorption layer.

8. The image pickup device according to claim 1, further comprising an adhesive layer on the low-refractive-index layer.

9. An image pickup device, comprising:
an on-chip lens that has a first refractive-index value;
a low-refractive-index layer on the on-chip lens, wherein the low-refractive-index layer has a second refractive-index value lower than the first refractive-index value;
a first infrared absorption layer on the low-refractive-index layer,
wherein the first infrared absorption layer comprises an infrared absorption material including a first infrared absorption pigment as fine particles,
wherein each of the fine particles has a minor axis greater than or equal to 1 nm and a major axis less than or equal to 50 nm;
a bandpass layer on the first infrared absorption layer, wherein the bandpass layer comprises at least a first film that has the first refractive-index value and a second film that has the second refractive-index value; and
a second absorption layer below the on-chip lens, wherein the second absorption layer comprises a blend of a second infrared absorption pigment and at least one color filter.

10. The image pickup device according to claim 9, wherein the infrared absorption material includes at least one of a binder resin or an additive.

11. The image pickup device according to claim 9, wherein the first infrared absorption pigment has a maximum absorption wavelength greater than or equal to 600 nm and less than or equal to 1200 nm and a molar absorption coefficient greater than or equal to 1000 L/mol cm.

12. The image pickup device according to claim 9, wherein the first infrared absorption pigment includes:
an anion part that has a first size, a first formula weight, and a first oxidation affinity, wherein at least one of:
- the first size is larger than a second size of a perchlorate ion,
- the first formula weight is greater than a second formula weight of the perchlorate ion, or
- the first oxidation affinity is less than a second oxidation affinity of the perchlorate ion; and
a cation part that has a third size, a third formula weight, and a third oxidation affinity, wherein at least one of:
- the third size is larger than a fourth size of an ammonium ion,
- the third formula weight is greater than a fourth formula weight of the ammonium ion, or
- the third oxidation affinity is less than a fourth oxidation affinity of the ammonium ion.

13. The image pickup device according to claim 9, further comprising a protection layer on the first infrared absorption layer, wherein the protection layer is configured to at least shield oxygen and moisture or suppress a physical damage to the first infrared absorption layer.

14. The image pickup device according to claim 9, further comprising:
an antireflection layer on the first infrared absorption layer,
wherein the antireflection layer is configured to prevent reflection of light inside the image pickup device.

15. The image pickup device according to claim 9, further comprising a support substrate configured to support the first infrared absorption layer.

16. The image pickup device according to claim 9, further comprising an adhesive layer on the low-refractive-index layer.

17. An image pickup device, comprising:
an on-chip lens that has a first refractive-index value;
a low-refractive-index layer on the on-chip lens, wherein the low-refractive-index layer has a second refractive-index value lower than the first refractive-index value;
a first infrared absorption layer on the low-refractive-index layer, wherein the first infrared absorption layer comprises an infrared absorption material including a first infrared absorption pigment and a binder resin; and
a bandpass layer on the first infrared absorption layer, wherein the bandpass layer comprises at least a first film that has the first refractive-index value and a second film that has the second refractive-index value.

* * * * *